(12) United States Patent
Holt et al.

(10) Patent No.: US 7,554,321 B2
(45) Date of Patent: Jun. 30, 2009

(54) COUNTER BALANCED VERTICAL DOCKING MOTION IN A DRIVEN VERTICAL AXIS TEST HEAD MANIPULATOR

(75) Inventors: Alyn R. Holt, Cherry Hill, NJ (US); Brian R. Moore, Cornwall (GB); Henri M. Akouka, Moorestown, NJ (US)

(73) Assignee: inTEST Corporation, Cherry Hill, NJ (US)

( * ) Notice: Subject to any disclaimer, the term of this patent is extended or adjusted under 35 U.S.C. 154(b) by 1226 days.

(21) Appl. No.: 10/204,069

(22) PCT Filed: Mar. 1, 2001

(86) PCT No.: PCT/US01/06456

§ 371 (c)(1),
(2), (4) Date: Oct. 8, 2002

(87) PCT Pub. No.: WO01/64389

PCT Pub. Date: Sep. 7, 2001

(65) Prior Publication Data

US 2004/0051517 A1   Mar. 18, 2004

(51) Int. Cl.
  *G01R 1/00* (2006.01)
(52) U.S. Cl. .................................... 324/158.1
(58) Field of Classification Search ............. 324/158.1, 324/72.5, 754–765; 73/866.5, 865.8, 865.9; 74/490.07, 490.01, 490.05; 248/178.1, 279.1; 414/668, 669, 670, 590
See application file for complete search history.

(56) References Cited

U.S. PATENT DOCUMENTS

| | | | | |
|---|---|---|---|---|
| 1,639,608 A | * | 8/1927 | Hofland | 54/32 |
| 3,994,476 A | * | 11/1976 | van Gennep | 254/272 |
| 4,527,942 A | * | 7/1985 | Smith | 414/590 |
| 4,705,447 A | * | 11/1987 | Smith | 414/590 |
| 4,973,015 A | * | 11/1990 | Beaucoup et al. | 248/124.2 |

(Continued)

FOREIGN PATENT DOCUMENTS

EP   0 526 996 A2   2/1993

(Continued)

OTHER PUBLICATIONS

European Search Report corresponding to application No. EP 01 91 4580 dated Nov. 9, 2004.

(Continued)

*Primary Examiner*—Vin P Nguyen
(74) *Attorney, Agent, or Firm*—RatnerPrestia

(57) ABSTRACT

A positioner, such as a test head carrier for a semiconductor wafer and device tester, includes a vertical support and a main arm for supporting a test head. The main arm is suspended for vernier movement by use of a counterbalancing force such as counterweights. The suspension of the main arm is performed at a mechanical advantage so that reduced counter-blancing force and correspondingly large movements on the counter-blance side are used to effect the vernier movement. The vertical support may be adjusted with a non-compliant drive such as a ball screw mechanism. The vernier movement can also be used to sense collisions and other positioning errors and actuation of the drive for the vertical support can be controlled accordingly.

51 Claims, 18 Drawing Sheets

U.S. PATENT DOCUMENTS

| | | | |
|---|---|---|---|
| 5,059,089 A | | 10/1991 | Kocaoglan |
| 5,149,029 A | * | 9/1992 | Smith ...................... 248/124.2 |
| 5,241,870 A | * | 9/1993 | Holt .......................... 73/866.5 |
| 5,506,512 A | * | 4/1996 | Tozawa et al. .............. 324/754 |
| 5,603,677 A | | 2/1997 | Sollo |
| 5,606,262 A | * | 2/1997 | Montalbano et al. ........ 324/758 |
| 5,818,219 A | | 10/1998 | Hama et al. |
| 5,886,488 A | * | 3/1999 | Nakajima et al. ........... 318/432 |
| 5,900,737 A | | 5/1999 | Graham et al. |
| 5,931,048 A | * | 8/1999 | Slocum et al. ........... 74/490.07 |
| 6,009,670 A | | 1/2000 | Howard |
| 6,023,173 A | * | 2/2000 | Khater et al. ............... 324/758 |
| 6,271,658 B1 | * | 8/2001 | Vallinan et al. .......... 324/158.1 |
| 6,396,257 B1 | * | 5/2002 | Baum et al. ............... 324/158.1 |
| 6,640,610 B2 | * | 11/2003 | Lueth et al. .................. 73/1.38 |
| 6,837,125 B1 | * | 1/2005 | Herrera-Abella et al. . 74/490.01 |

FOREIGN PATENT DOCUMENTS

| | | |
|---|---|---|
| EP | 0 609 633 | 7/1993 |
| JP | 08324913 A * | 12/1996 |

OTHER PUBLICATIONS

European Search Report corresponding to Application No. 06 00 1973 dated Jun. 19, 2006.

International Search Report dated Apr. 26, 2002 for PCT/US01/06456.

* cited by examiner

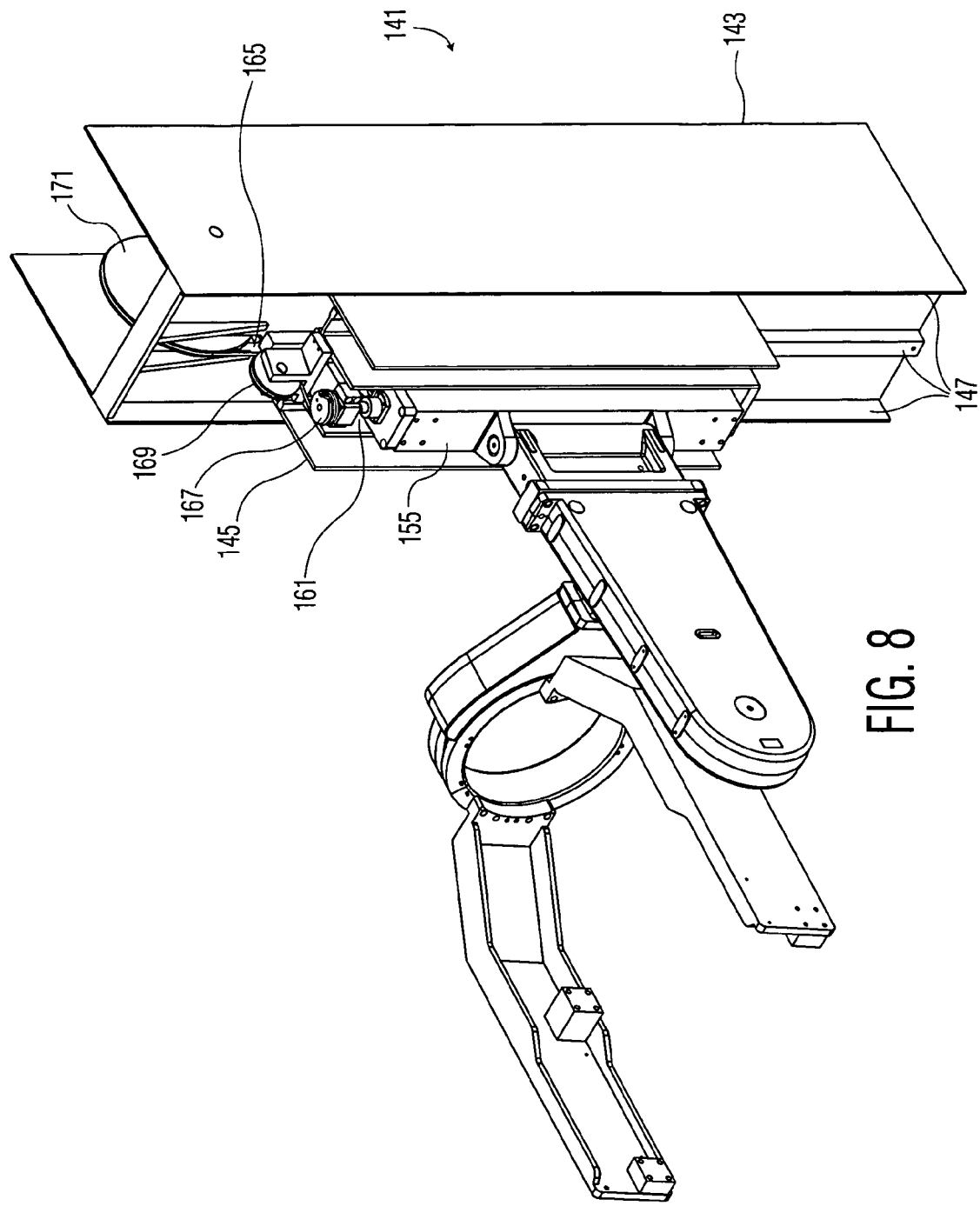

COUNTER BALANCED VERTICAL DOCKING MOTION IN A DRIVEN VERTICAL AXIS TEST HEAD MANIPULATOR

FIELD OF THE INVENTION

The present invention relates to the field of art of electronic test head positioners.

BACKGROUND OF THE INVENTION

In the automatic testing of integrated circuits (IC) and other electronic devices, special equipment may be used to bring the device to the proper temperature and place the device to be tested in position. The electronic testing itself is provided by a large and elaborate automatic testing system which includes a test head. The test head is often densely packaged with electronic circuits in order to achieve the accurate high speed testing of the sophisticated devices. The testing system with the test head has been required to connect to and dock with a device handler or other equipment for supporting the electronic devices. Test head positioning systems are well known in the field of automatic testing of semiconductor devices.

In such testing systems, the test head is very heavy, on the order of 40 to 500 kilograms. Recently, test equipment has been introduced which use test heads of upwards of 1000 kilograms or more. The reason for this heaviness is that the test head uses precision high frequency control and data signals so that the electronic circuits may be located as close as possible to the device under test.

For purposes of this explanation, a unit under test (UUT) is a device such as a circuit or subassembly undergoing a test. A device under test (DUT) is the present device (IC) undergoing test. The DUT is a particular type of unit under test (UUT). A test station apparatus (TSA) refers collectively to wafer probers, device handlers and manual test stations. A test head is an operating head which is specifically designed for testing.

Recent advances in the semiconductor industry have had the following effects:

1. DUTs have become more complex; the number of transistors per device has grown steadily from a few thousand to a few million.
2. DUTs have become increasingly complex mixtures of digital circuitry, analog circuitry, and mixed signal circuitry.
3. The number of I/O, power supply and signal ground reference pins per device has grown to several hundred from less than one hundred
4. DUT clock rates have gone from 10's of Mhz to at least 1 Ghz.
5. Data, Address and Control signals are accordingly in at least the 100's of Mbps range.
6. Per pin frequency bandwidth requirements are at least in the 10's of Ghz range.

As a result, desired test system design changes are made to accommodate the following considerations:

1. The test head includes more, faster and more complex pin-electronics circuits.
2. Greater power dissipation per pin circuit in the test head can be expected due to the higher switching rates.
3. Water cooling systems with circulating water have been added to the test heads, increasing their weight and necessitating flexible plumbing to be included in the test head cable.
4. More power supply and ground conductors of heavier gauges are in the interconnecting test head cable.
5. Circuitry is relocated from the system cabinet to the test head to reduce the amount of signal wiring and associated delays in the cable.

These factors have driven the size and weight of test heads to increase significantly:

1. The demand that the test head be brought into close proximity to the DUT is increasingly important.
2. The cable from test head to tester cabinet should be kept as short as possible while at the same time it has become thicker and stiffer.

Thus, test heads and their associated cables have become significantly larger and heavier.

The test head positioning system is a mechanical device that allows an operator to bring an automatic test equipment test head weighing hundreds of pounds into proximity with a device handler, wafer prober or other test station apparatus (TSA) and to allow the test head to be docked with the TSA. As semiconductor chips have and continue to become faster and more complex, the size and weight of test heads have continually grown larger. What is more, the size and weight of the cable that connects the test head to the automatic test equipment cabinet have correspondingly increased. These factors have created demand for test head positioning systems with both an increased load carrying capacity and an increased range of motion. Overall it is very challenging to design an apparatus that can freely move loads approaching many hundreds of pounds and that exert moments in the range of 100,000 inch-pounds or more on the supporting structure.

The test head positioning system may be used to position the test head with respect to the device handler or other test station apparatus (TSA). When the test head is accurately in position with respect to the TSA, the test head and the TSA are said to be aligned. When the test head and TSA are aligned, the fragile test head connectors and TSA electrical connectors can be brought together (i.e., docked), enabling the transfer of test signals between the test head and the TSA. Prior to docking, the fragile test head connectors and TSA electrical connectors must be precisely aligned to avoid damaging the fragile electrical connectors.

A test head positioner system may also be referred to as a test head positioner or a test head manipulator. This technology is described, for example, in the inTEST Handbook, inTEST Corporation. This technology is also described, for example, in U.S. Pat. Nos. 6,057,695, 5,900,737, 5,608,334, 5,450,766, 5,030,869, 4,893,074 and 4,715,574 which are all incorporated by reference for their teachings in the field of test head positioner systems.

Test heads, and their respective positioners, are often used in a clean room environment. Clean room environments are often expensive to provide, and so the useable space is available at a premium. A variety of test head positioning systems are currently available for use in clean room environments. Although some of these test head positioning systems have a variety of desirable features, the amount of space which each of these test head positioning systems requires for proper operation may be undesirable. As device testing has developed to handle ever more increasingly complex tasks, test heads have continued to increase in size and weight. As test heads get larger and larger, fully manual, fully balanced methods become ever more difficult to actually implement in hardware, and further improvements are called for.

Ideally, a heavy load such as a heavy test head would be supported in a substantially weightless condition for relevant movements. "Substantially weightless" means that force required to position the heavy load is substantially less than that which would be required to lift the load.

The test head positioning system innovations disclosed in U.S. Patent Application Serial No. PCT/US00/00704 (which is incorporated herein by reference) have proved helpful in many situations. These innovations have provided a fully balanced manipulator that provides six degrees of motion freedom to the test head. The system is counterbalanced and the test head cable is managed so that the test head can be easily moved in all six degrees of freedom with little force. This allows an operator to easily position the test head and allows the test head docking mechanism to readily draw the test head in to precise alignment with the TSA test site. Also independent motion in each degree of freedom is facilitated.

When the test head is in motion, the total mass in motion includes the test head, the counter weights, and all moving portions of the manipulator. The total mass in motion is much greater than just the mass of the test head and is correspondingly very high. Operators can be intimidated and fearful of manually manipulating such a massive object and apparatus, even if it is fully balanced and requires only a small amount of force. Incorporation of powered axes with remote controls has become a desirable feature; however, while docking, the dock actuation mechanism takes over control of the manipulator; and it is then preferred to have the manipulator in a compliant condition to allow the test head to freely move with little force in all axes simultaneously. Many users prefer to leave the manipulator in a free-to-move, balanced condition while testing to absorb vibrations from the test handling automation equipment.

The increased range of motion requirements combined with the increased structural requirements lead to the situation where the manipulator can become too large to be shipped conveniently. In particular the maximum height of a shipping container and pallet with skids is limited to approximately 109 inches (approximately 9 feet) by existing trailer trucks and the largest commercial cargo airplanes (Boeing 747s). Overall vertical motion requirements are presently approaching 48 inches; when combined with the structural requirements for the base and column, and assuming a vertical column of fixed height, this leads to a system that is too tall to be conveniently shipped.

A solution to the height problem is to utilize a column made of two or more segments that can be collapsed, folded or telescoped. Manipulators with telescoping vertical columns have been known for several years. Indeed, until recently, the extra costs of constructing a telescoping vertical column have not been justifiable. Much more recently, U.S. Pat. No. 5,931,048, to Slocum et al, and U.S. Pat. No. 5,949,002, to Alden, disclose a manipulator having a motor driven telescoping column. In '048 a pneumatic mechanism is used to provide vertical axis compliance for docking. The '002 patent observes that such a solution has limitations and seeks to improve compliance by using a load cell as a sensor in an automatic control system feedback loop. This active compliance technique adds to system cost and complexity, particularly when safe operation in the event of failures and unplanned obstructions to motion are considered. A more desirable arrangement would be a motor driven vertical axis, which may or may not be of the telescoping type depending upon system requirements, that includes counterweights in a fashion that allows essentially weightless counterbalanced motion for docking and testing operations.

Present manipulators which use counter weights typically are configured so that the total weight of the counter weights is approximately equal to the load. The load consists of the test head, its movable support apparatus, and a portion of the cable. Thus the counter weights can be more massive than the test head itself. As test heads become heavier this leads to certain undesirable situations as follows:

The volume required to house the weights within the manipulator becomes unmanageable.

The total amount of weights that must be handled in the installation of a new test head as well as the storage of unused weights becomes likewise unmanageable.

System inertia and certain restraining frictional forces also vary as approximately two times the test head weight plus the weight of movable manipulator components.

Loading effects on column, platform, cable pulleys, and other subassemblies grow at twice the growth rate of test head weight. These loading effects can also have an adverse effect on overall system friction and, consequently, the force required to position and dock the test head.

The movable plates and other apparatus of a movable base unit have appreciable mass which grows with test head weight and which contributes significantly to total system inertia.

Positioning heavy objects is generally very difficult. Manipulation of heavy objects is typically performed with power assist, by servo mechanisms and by load balancing. Each of these techniques has disadvantages. In particular, if an operator of equipment manipulating a heavy object cannot completely control relevant movement, the result could be serious bodily injury or equipment damage.

In some cases, the load may have a slight bias, so that only a small fraction of the total weight of the load would be reflected in the force required to adjust a position of the load. Thus if a 300 kg load were to be positioned, it would be very difficult to move the load without mechanical or power assistance. If the force required to move the 300 kg load were 5 kg, it would be much easier to manipulate the load. In addition, there is substantially reduced danger to the machine operator who may get caught between the load and another object. Since the 5 kg is insignificant as compared to the 300 kg, the load is considered to be suspended in a "substantially weightless" condition.

A positioner, able to move along a support structure, carries the test head to the desired location at which the test head is positioned to connect to and dock with the TSA. The test head is attached to the positioners so that the test head can achieve up to six degrees of motion freedom: X, Y, Z, θX, θY, θZ.

To be consistent with descriptions of test head positioner systems in the prior art, the coordinate system 100 illustrated in FIGS. 2 and 3 is used in which:

Y=vertical, up-down axis 102

X=horizontal, side-to-side or left-right axis 104

Z=horizontal, in-out axis 106.

When viewed from the front of the manipulator, this forms the Cartesian coordinate system.

Rotations about the axes are designated as follows:

θY (thetaY)=rotation about the Y axis (hereinafter referred to as "swing" or "yaw") 108

θZ (theta Z)=rotation about in-out axis (hereafter referred to as "roll" or "twist") 110

θX (theta X)=rotation about X axis (hereinafter referred to as "tumble" or "pitch") 112

Referring specifically to FIG. 3, the test head 305 used in a preferred embodiment of the present invention includes a test interface 310 on one surface. The test interface 310 typically holds a test interface board 315, which in addition to other functions, provides connection points to the test apparatus in the prober, handler, manual test station, or other test station apparatus (TSA). As shown in FIG. 3, the test head 305 has a length 312, a thickness 313, and a width 314. The surface having the test interface 310 is hereinafter called the "interface surface" (IS) 310. The IS defines both a plane and a direction; the direction is described by a vector normal to the IS plane and pointing away from the test head. FIG. 3 shows the IS 310 in the horizontal plane with upwards direction. In use, the orientation of the test head will change as it is docked with different types of equipment. Accordingly, both the plane and the direction of the IS 310 will also change.

In use, the test head may be brought upwards into contact with the DUT as in the TSA. In this case, the interface surface 310 is facing up (IS UP). Another alternative is that the test head may be brought downward into contact with the device as in a prober. In this case, the interface surface 310 is facing down (IS DOWN). Thirdly, both the DUT and the IS 310 may be oriented in a vertical plane (IS vertical). Fourthly, both the DUT and the IS 310 may be oriented at any angle between the IS up and IS down. As the test head is moved from one apparatus to another, it is clear that the test head must be rotated among IS UP, IS DOWN, and IS Vertical positions. Depending upon the manipulator, this may be effected by rotation in either the tumble (pitch) or roll (twist) coordinates.

The test head is connected to the test cabinet by a large, thick bundle of cables (not shown). The cables, size, weight and resistance to flexing and twisting all interfere with and constrain test head motion. Test head motion is desirably performed in a manner to protect the cable from several factors as described, for example in U.S. Pat. No. 5,608,334.

Many test heads, particularly large ones, are attached to the manipulator using a cable-pivot apparatus. In the cable-pivot mode, the cable is brought from the test head at the center of rotation and parallel with the axis of rotation (normally the roll or twist axis). This is described, for example, in U.S. Pat. Nos. 5,030,869, 5,450,766 and 5,608,334. A mechanism to support the cable is described, for example, in U.S. Pat. No. 4,893,074.

Several manipulators provide two motions or more in their bases. A manipulator manufactured by Teradyne and described in U.S. Pat. Nos. 5,931,048 and 5,949,002, referenced above, use such a motion. The Teradyne device provides swing rotation and side-to-side motion in its base with the swing mechanism at the bottom; in-out motion in this manipulator is provided in the arm and cradle assemblies. A further manipulator manufactured by Reid-Ashman Mfg., Inc., provides side-to-side and in-out motion in the base with swing provided by rotation of the arm about a shaft attached to the column. A manipulator manufactured by Schlumberger provides side-to-side motion and swing rotation motion in its base with the swing mechanism on top of the side-to-side mechanism. In-out and roll motions are provided in the arm assembly. This manipulator is unique in that the cable passes from the cabinet, through the center of the column above the center of rotation, to terminate at the test head. Also unique to this manipulator is a spring mechanism that serves as a counter balance which was first described in U.S. Pat. Nos. 4,943,020 and 4,973,015, both assigned to Schlumberger. Finally, a further manipulator, also manufactured by Reid-Ashman Mfg., Inc., provides all three motions in its base with the swing rotation mechanism at the bottom.

Drive mechanisms such as motors and other actuators can be classified as "compliant" and "non-compliant" according to the tendency of a force on the driven object to move the drive mechanism. For the purposes of this specification, if a force on the driven object can easily move the drive mechanism, then the drive mechanism is considered to be "compliant." If a force on the driven object is normally unable to move the drive mechanism, the drive mechanism is considered to be "non-compliant."

In mundane terms, if a drive motor can be readily driven forward or backward by forcing on the driven object at its output, the drive motor is "compliant." If forcing on the driven object will break the drive mechanism, or if an inordinate amount of force is required to force the drive motor by the driven object, the drive motor is "non-compliant." This is often the case with geared drive motors. Usually non-compliant drive mechanisms have high drive reductions, so that, for example 1000 turns of a motor will result in 1 turn of a driven gear. The non-compliant nature of drive mechanisms is usually the result of gear reduction, in which the small amounts of friction or latent magnetic force will prevent back driving of the mechanism. It is also possible to make a drive non-compliant with valves or brakes.

In order to provide all of the advantages of a fully balanced manipulator in all six degrees of motion freedom, it is desired to allow fully balanced, substantially weightless, displacement-independent vertical motion for test head docking in a test head manipulator. It is also desired that the test head manipulator have its main vertical motion driven via a screw or other non-compliant mechanism. Furthermore, to reduce loading on the vertical column and on its base, it is desired that the total weight of the counter weights is to be significantly less than the combined weight of the test head, cable load, and support apparatus. It is also desired to have a technique that may be used with manipulators where the main vertical motion is provided by a telescoping column as well as with fixed-column manipulators, where the test head is moved along a column of fixed height. Because precision test head docking requires simultaneous motion in all six degrees of freedom, it is desired that motion freedom be maintained in the other five degrees of freedom simultaneously with the vertical motion.

Regardless of the particular means to control motion and counterbalancing of the motion, it is desirable that accidental collisions be avoided and if an accidental collision does occur, the powered mechanism be able to react in order to minimize the effects of the collision. Sensing and reacting to accidental collisions is a particular problem when multiple drive mechanisms are used to achieve movement in one direction.

Further objectives are to provide safety features for both the operator and test head. From a safety standpoint, it is desired to provide adequate structural support for the test head so that it cannot fall to the ground or through a distance of more than approximately two inches in the event that the counterbalance mechanism fails or becomes unbalanced. A second safety objective is to have the ability to detect undue resistance to vertical motion from any causes including collisions with another piece of apparatus or with a human, interference by improper human interaction, collision or interference with the docking mechanism, etc.

Test head positioners, like other heavy machinery, are built with safety considerations inherent in their design. Larger, heavier test heads lead to greater chances of accidental collisions due to the unplanned physical displacement of other test floor apparatus into the planned test head motion envelope, humans unexpectedly getting into the path of motion, operator errors, control system malfunctions, and the like. With more-massive, more-expensive test heads, the damage to property, equipment and humans that can be caused by an accident can be significant and even lethal. In the case of manually powered motion, the human operator can typically feel an obstruction and can accordingly stop or reverse motion and avoid damage. With a powered manipulator axis that is remotely controlled by either an operator or by an automatic control system, special means must be employed to detect an obstruction or collision and to avoid causing significant damage. In U.S. Patent Application Serial No. PCT/US00/00704, it is taught that if the controlled axis is balanced so that only a minimal amount of force is required to cause motion, then current limited dc motors can be effectively used. Because an obstruction, even a soft one, will cause the force required for motion to increase, the motor will stall and the force transferred to the obstruction will be limited to a safe amount.

If the main vertical motion is to be unbalanced, the vertical drive must lift the entire weight of the test head and its supporting apparatus. The drive motors would not necessarily notice the additional force imposed by an obstruction. Accordingly, if the manipulator is to have a driven main vertical motion that is not counter balanced combined with a secondary, or vernier, vertical motion for docking, it would be highly desirable to include a means for detecting obstructions and collisions while the main vertical drive is in operation. As used in this description, "vernier" refers to a small auxiliary device used with a main device to obtain fine adjustment.

SUMMARY OF THE INVENTION

A load is supported by a drive mechanism for effecting a first positional adjustment and a coupling mechanism for effecting a second positional adjustment. The coupling mechanism has a mechanical advantage greater than one, so that a balancing force applied at an input part of the coupling mechanism is increased as a result of the mechanical advantage to provide a greater resultant force applied to the load.

BRIEF DESCRIPTION OF THE DRAWINGS

FIG. 8 is a front perspective view of a non-telescoping positioning system constructed according to an exemplary embodiment of the present invention.

DETAILED DESCRIPTION OF THE INVENTION

Figure 1:
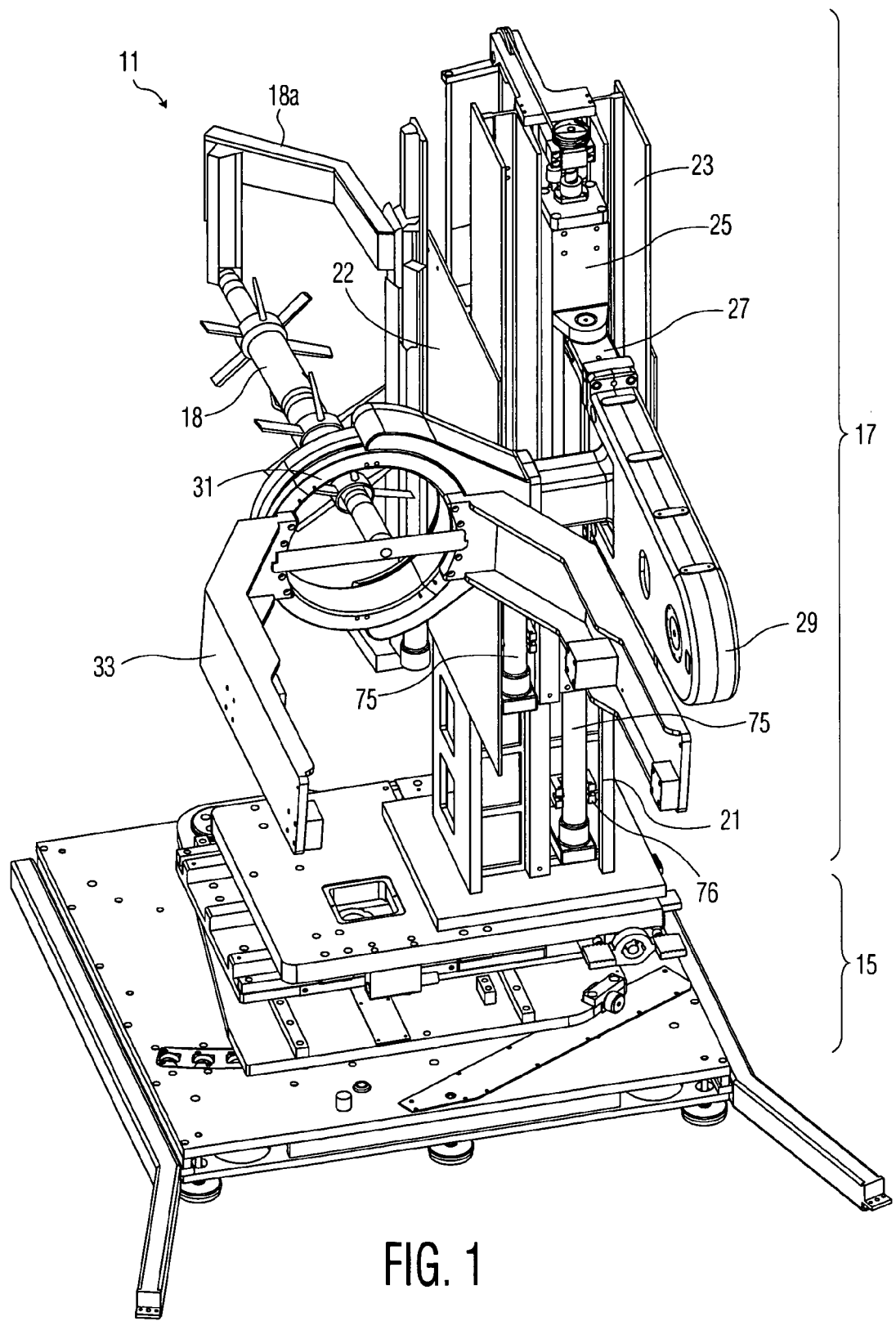
FIG. 1 is a perspective drawing of a manipulator in accordance with an exemplary embodiment of the present invention.

The test head is held and supported by apparatus that is attached to the main arm of the manipulator. The main arm is slidingly attached with a sliding mechanism, such as a linear rail and bearing combination, to a vertical arm support that is driven in the up-down direction by a non-compliant drive mechanism, such as a motor-driven or a hand-crank driven screw. The amount of vertical motion of the main arm relative to the vertical arm support is physically limited to an amount sufficient to allow docking of the test head; this is typically plus or minus one inch. This is referred to as vernier vertical motion. A coupling mechanism that has a mechanical advantage greater than one is used to couple the main arm to the vertical arm support. This device has a fixed part directly connected to the vertical arm support (e.g. the fulcrum in the case of a lever), a load bearing part coupled to the main arm, and an input part to which counter weights are attached. If the mechanical advantage is MA, then the weight of the counter weights is the weight of the load (test head, main arm and mechanical supports, and test head's share of the cable weight) divided by MA. This allows the main arm and its load to move virtually weightlessly in its vertical vernier motion; the only resistance to said vertical vernier motion being that of friction in coupling mechanism, friction in the sliding mechanism, and forces arising from any cable movement. If the cable is positioned essentially in the horizontal plane at approximately the same height as the center of gravity of the test head, then the forces due to the changing of cable position will be negligible over the plus or minus one inch of vertical test head travel. A telescopic cable support arm with a horizontal-leveling device as disclosed in U.S. Patent Application Serial No. PCT/US00/00704 provides this capability.

A preferred coupling device is a high-pitch, low-friction, back-drivable ball screw. Such a device is known to be a compact and highly efficient converter of rotational to linear motion that can readily provide a suitable mechanical advantage. An exemplary embodiment based on such a device is described later. The ball screw is used to effect motion of main arm by driving the main arm, but it should be noted that the ball screw is a driven mechanism in the sense that the counterweights drive the ball screw, and the main arm back-drives the ball screw. Therefore, the use of the term "drive" when applied to the ball screw means that force is transferred through the ball screw, and that the ball screw is used as a mechanical advantage device. The driving force transferred through the ball screw typically would be from a torque-limited motor, force applied by hand, external force, or the counterweights.

The vertical arm support to which the main arm is attached may be the distal movable section of a telescoping column; or it may be a structure that slides along one or more shafts attached to a fixed-height column or one or more linear rails attached to a fixed-height column. Thus, the vertical column may be either of the telescoping type or of the fixed height type.

One or more linear actuators are used to drive the vertical motion of the vertical arm support and its load (hereinafter "system load"), which comprises the main arm, the test head support apparatus, the test head, the test head's share of the cable and cable support weight, and the counter weights. The actuators are typically motor-driven screw mechanisms that have a thread pitch and internal friction sufficient to prevent back driving under the full load. Thus, the screw is sufficient to support the full system load at any height within the range of the system. Furthermore, the screw mechanism is selected to have a total load rating greater than approximately 3.5 times the system load without breaking. Also the lower physical stop for the vertical arm support is designed so that it can bear the entire system load with a safety factor of at least approximately five. The combination of these aspects yields assurance that the first safety objective; namely, to provide adequate structural support for test head so that it cannot fall to the ground or through a distance of more than approximately two inches in the event that the counterbalance mechanism fails or becomes unbalanced, is reasonably achieved.

With the load properly counterbalanced, the main arm typically should never significantly move with respect to the vertical arm support except when driven by the dock actuator during docking and undocking. If such motion does occur, then it is probably indicative of an accidental event.

The vertical vernier axis is further equipped with position-sensing means, and it may also be equipped with motion sensing means. Also, if desired, a torque-limited drive motor coupled via a clutch as described previously in U.S. Patent Application Serial No. PCT/US00/00704 may be provided. It is recognized that in some embodiments it will be possible to combine position and motion sensing devices in that the two quantities are mathematically related. The purpose of the motion sensing means is to detect when there is motion of the main arm relative to the vertical arm support; unless the docking actuator is being operated, such motion would indicate that an obstacle or other unsafe condition has been encountered. The position sensor desirably indicates when the main arm is approximately centered within its range of vertical vernier motion. Aspects of an overall control methodology include:

The main arm is desirably approximately centered within its range of vertical vernier motion before the main vertical motion screws can be actuated. This insures that if an obstacle or other unsafe condition is encountered it will be detected.

The motion sensor is used to detect such relative motion and to provide a warning signal that can be utilized by the overall system to stop motion or to take other safety related action. The preferred action taken upon detection of such an event is to remove power from the vertical actuator and from any other axes, which might be simultaneously under powered motion.

The vertical vernier axis drive motor is used to center the main arm with respect to the vertical arm support before main vertical motion is energized. The clutch is engaged only when the drive motor is called upon to drive the vernier axis. Thus, the motor is normally decoupled and does not interfere in any way with either docking or obstacle detection. Because the motor is torque limited, damage will be prevented if an obstacle is encountered during the centering motion. A timer may be incorporated to detect this condition.

The torque-limited motor can be located on either side of the ball screw mechanism; however the gearing and torque limitations must take into consideration the mechanical advantage of the ball screw mechanism.

In order to provide freedom of motion in all six axes simultaneously, the above innovations are preferably used with a suite of techniques, which have been previously patented and/or disclosed. These include:

A test head cable pivot and associated apparatus as described in U.S. Pat. Nos. 5,030,869, 5,450,766 and 5,608,334.

A telescoping cable support arm as disclosed in U.S. Pat. No. 4,893,074 in conjunction with a cable support arm leveler as described U.S. Patent Application Serial No. PCT/US00/00704.

A base for the column that provides in-out, side-to-side, and swing motion where the center of swing motion is at a point between the column and tester cabinet and preferably near the point where the cable exits the tester cabinet as further described in U.S. Patent Application Serial No. PCT/US00/00704.

FIG. 1 is a perspective drawing of a manipulator 11 incorporating the present invention. Earlier patents and publications have described some elements of the manipulator 11, and these are noted in the descriptions. Referring to FIG. 1 the manipulator 11 includes a base 15 that provides swing motion, in-out motion, and side-to-side motion. This base is described in further detail in U.S. Patent Application Serial No. PCT/US00/00704. The three axes of the base may or may not be powered depending upon the application. Mounted on the base is the manipulator column. 17 The column 17 may be either of the fixed height type or of the telescoping type (shown in FIG. 1).

As shown in FIG. 1, the telescoping column 17 is comprised of three telescoping segments: a lower segment 21, a middle segment 22, and an upper segment 23. In this case the upper segment 23 is also the vertical arm support, and a main arm 25 is slidingly attached to it. The main arm 25 supports a horizontal arm assembly 27 that in turn supports a cradle pivot assembly 29, a cable pivot assembly 31, and a test head yoke 33. A test head (not shown) is attached to the test head yoke 33 and is normally carried by the test head yoke 33 as the load. It is noted that any of a wide variety of other types of attachment mechanisms can be substituted. Vertical vernier relative motion between the main arm 25 and the vertical arm 23 support has a range of approximately plus or minus 1 inch (25 mm) and is enabled by a mechanism that includes a ball screw and counterweights (not shown in FIG. 1). A telescopic cable support arm 18 provides effectively balanced roll motion through the telescopic cable support arm leveling mechanism 18a.

Figure 2:
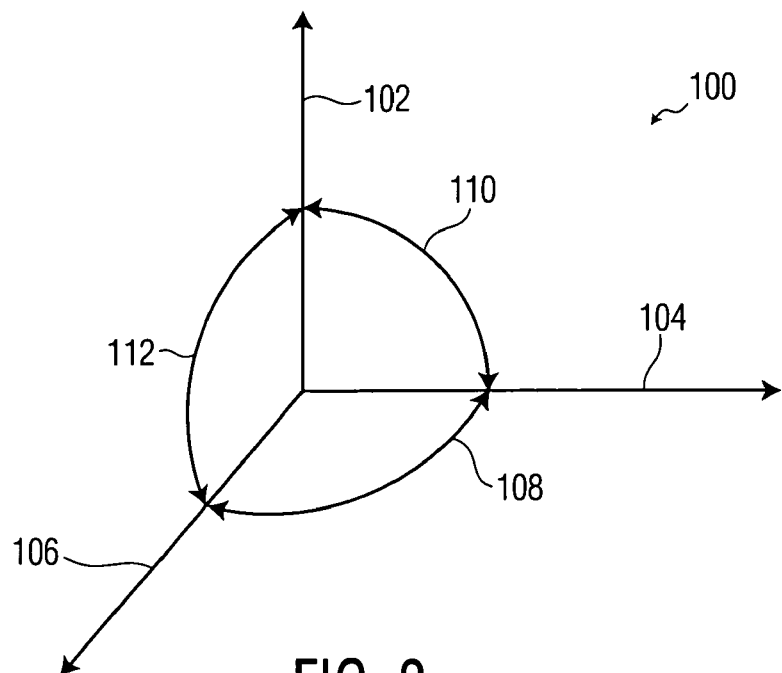
FIG. 2 is a diagram of a coordinate system used to describe the manipulator and its motion.
Figure 3:
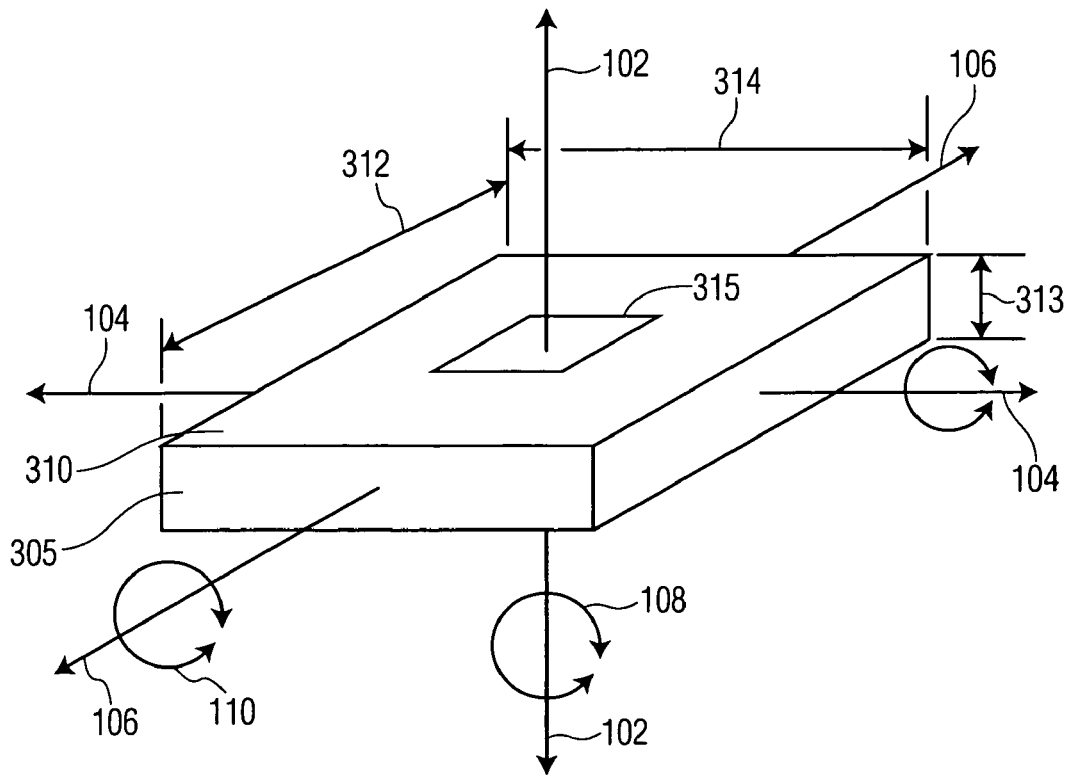
FIG. 3 is a diagram of a coordinate system used to describe the test head and its motion.

FIGS. 2 and 3 illustrate the coordinate systems and nomenclature used to describe the manipulator, test head, and their motions. As described in U.S. Pat. Nos. 5,030,869, 5,450,766 and 5,608,334, the cradle pivot assembly 29, a cable pivot assembly 31, and test head yoke 33 support the test head in a manner that provides simultaneous degrees of freedom in pitch and roll. Following known practices described in these patents as well as the inTEST Handbook, the pitch and roll motions are balanced for low effort docking. Depending upon specific application requirements additional degrees of freedom may also be provided in the horizontal arm 27 structure including swing, in-out, and side-to-side. These additional degrees of freedom in the horizontal plane may occur either singly or in combinations, and furthermore these additional motions may be redundant to motions provided elsewhere in the manipulator. Examples include, but are not necessarily limited to, the following:

The horizontal arm assembly 27 may be comprised of a single upper arm rigidly attached to both the main arm 25 and cradle pivot assembly 29. This configuration provides no additional degrees of freedom.

The horizontal arm assembly 27 may consist of a single upper arm that is rigidly attached to the cradle pivot assembly 29 and attached in a hinged fashion to the main arm 25 to enable swing motion in the horizontal plane.

The horizontal arm assembly 27 may consist of an upper arm hinged to the main arm 25, a forearm hinged to the upper arm, and a hinged connection to the cradle pivot assembly 29 in a manner to allow simultaneous in-out, side-to-side, and swing motions in the horizontal plane.

The horizontal arm assembly 27 may consist of two upper arms of equal length and two forearms also of equal length arranged in a quadrilateral. Both upper arms are hinged to the main arm 25, each forearm is hinged to its respective upper arm, and both forearms are hinged to the cradle pivot assembly 29. This structure would enable simultaneous in-out and swing motion in the horizontal plane while inhibiting side-to-side motion.

Those skilled in the art will recognize that there are many possible ways to construct a horizontal arm assembly 27.

Figure 4:
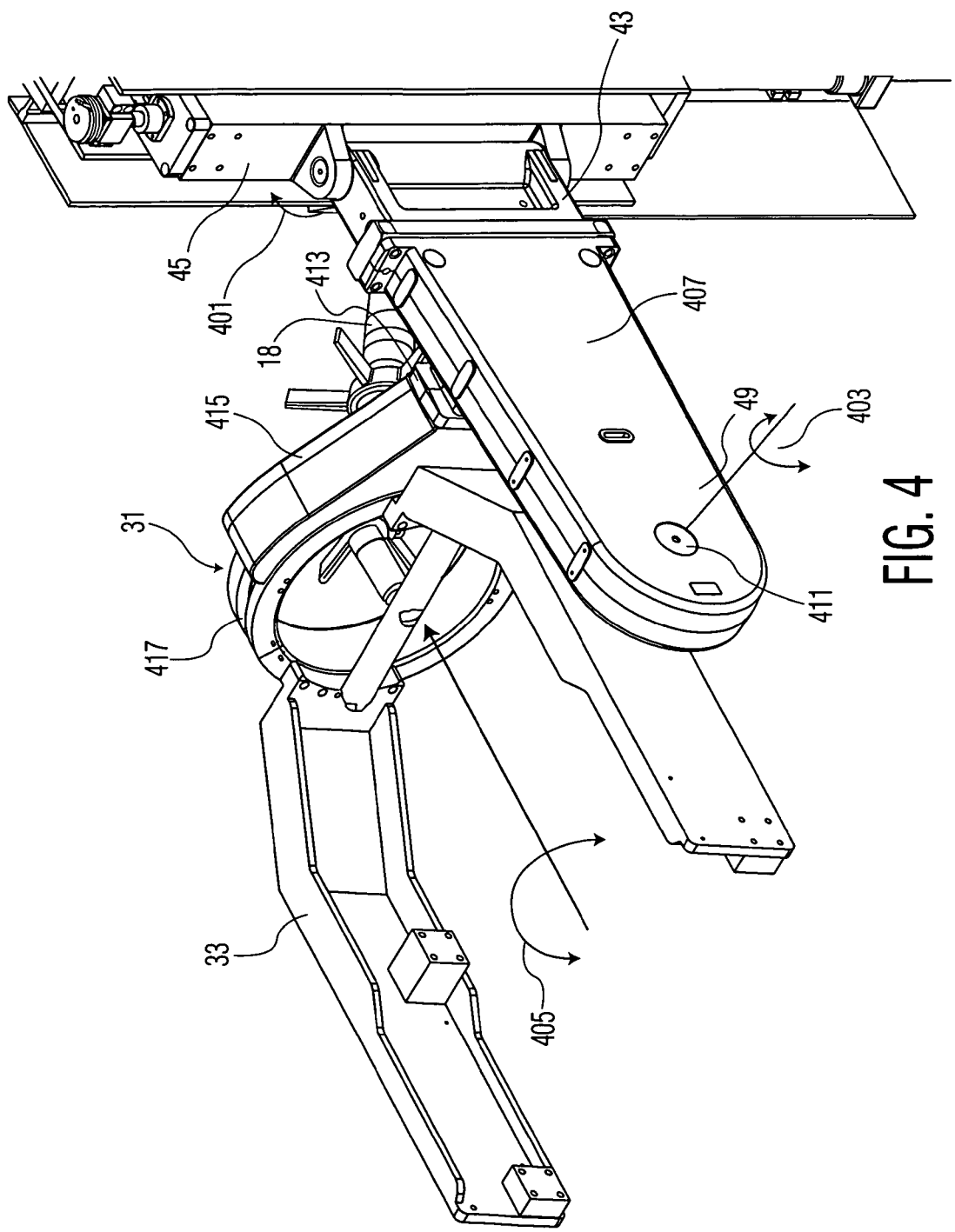
FIG. 4 is a perspective drawing showing a horizontal arm assembly using a single upper arm directly attached to a cradle pivot assembly.

A configuration using a single upper arm 43 attached to the main arm 45 and rigidly attached to a cradle pivot assembly 49 and attached in a hinged fashion is shown in FIG. 4. This generally corresponds to the second possibility in the above list. In particular the main arm 45 engages the upper arm 43 that is directly connected to the cradle pivot assembly 49 such that this connection allows the upper arm 43 to articulate with respect to the main arm 45 and thereby provide a limited plus/minus (approximately) 5 degrees of secondary or vernier swing motion. This means that the plus/minus 5 degrees of motion is in a horizontal plane. This plus/minus 5 degrees of swing motion is designated as 401 in FIG. 4. As described in U.S. Pat. Nos. 5,608,334, 5,450,766, and 5,030,869 and "The inTEST Handbook," the upper arm 43 engages (typically) the cradle pivot assembly 49 to provide an approximate plus/minus 5 degrees of balanced pitch motion. This plus/minus 5 degrees of pitch motion is designated as 403 in FIG. 4. The cradle pivot assembly 49 comprises an outer cradle back 407 that is connected via a cradle pivot shaft 411 to an inner cradle back 409 (not shown) that is in turn connected with a cradle side 413. It is noted that any of a wide variety of other types of attachment mechanisms can be substituted for the cradle in the cradle pivot assembly 49 shown in FIG. 4. A cable pivot assembly 31 comprising a cable pivot housing 415, which is attached to the cradle side 413, that is rotationally engaged with test head adapter ring 417, which is fixedly attached to the test head (not shown) via a test head yoke 33, provides approximately plus/minus 95 degrees of roll motion in most applications. This plus/minus 95 degrees of roll motion is designated as 405 in FIG. 4. Total roll motion of typically up to plus or minus 95 degrees (190 degrees total) can be provided in certain situations. Typically and preferably a telescopic cable support arm 18 is used to provide effectively balanced roll motion and by the use of a telescopic cable support arm leveling mechanism 18a (see FIG. 1) as is described in U.S. Pat. No. 4,893,074 and U.S. Patent Application Serial No. PCT/US00/00704. In combination the cable pivot 31, the telescoping cable support arm 18, and the leveling mechanism 18a effectively minimize variations in forces exerted by the cable on the test head as the manipulator is moved through its motion envelope. Alternatively, a tumble mode test head support mechanism may be utilized which provides, for example, plus/minus five degrees of roll motion and plus/minus 95 degrees (or more if need be) of pitch motion. Optionally, the roll (or—for a tumble mode—the pitch) axis may be powered and clutched in the manner described in earlier disclosures. The remaining axes that are supported by the main arm may also be powered in a similar manner if desired.

Figure 5A:
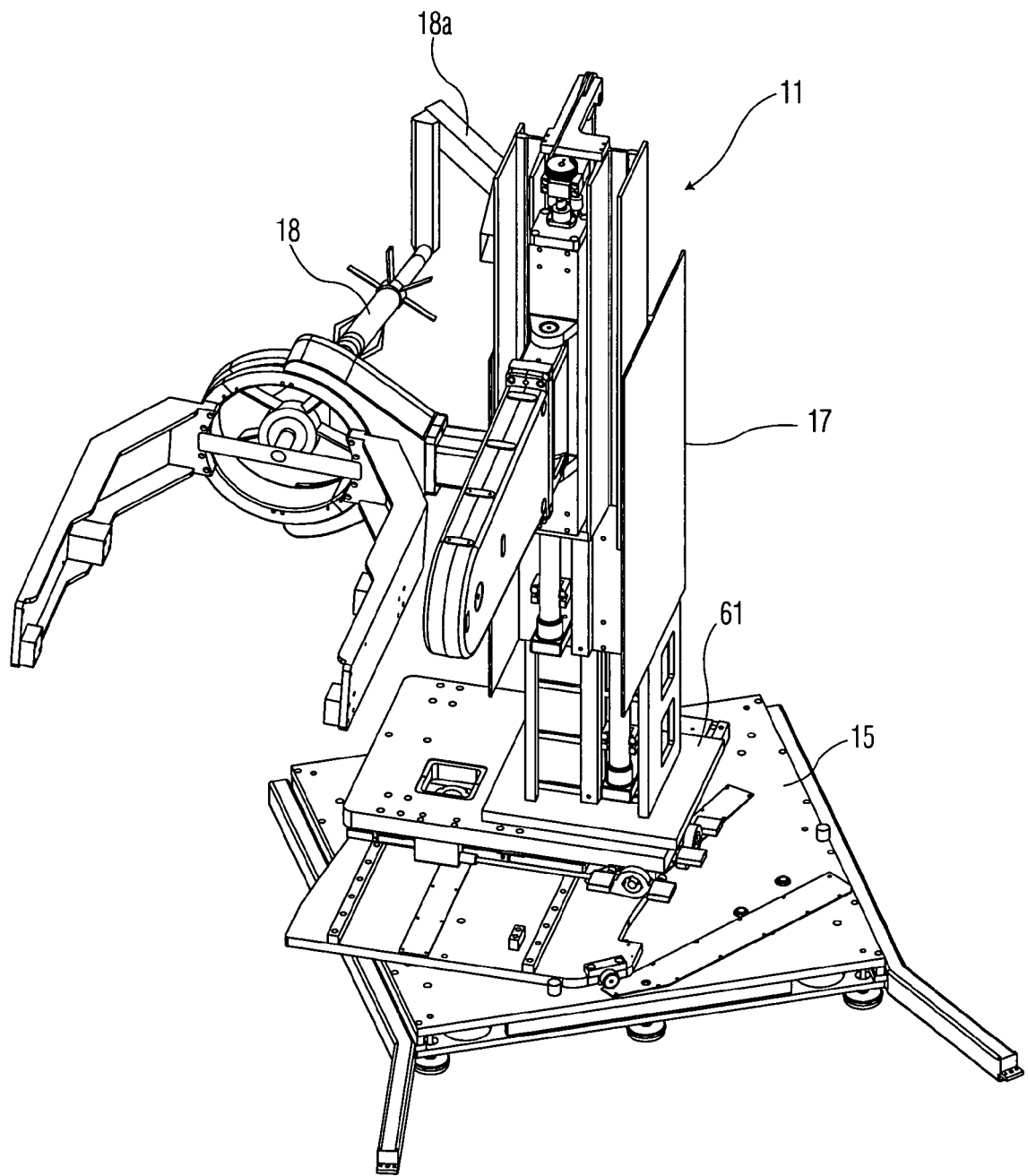
FIGS. 5A through 5C are perspective drawings of a positioner constructed in accordance with an exemplary embodiment of the present invention, illustrating the interaction of the manipulator axes of FIG. 1 and six degrees of freedom.
Figure 5B:
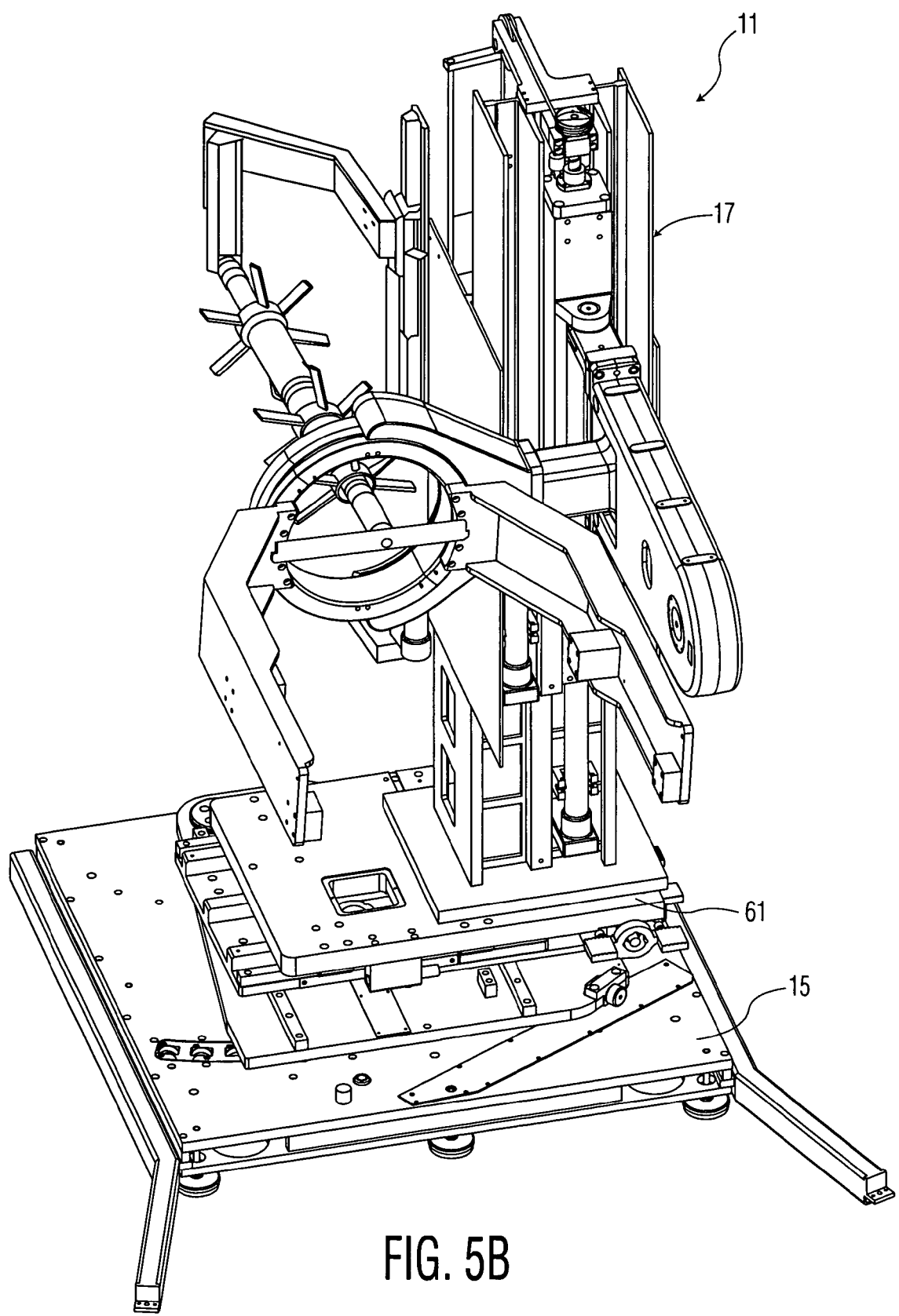
Figure 5C:
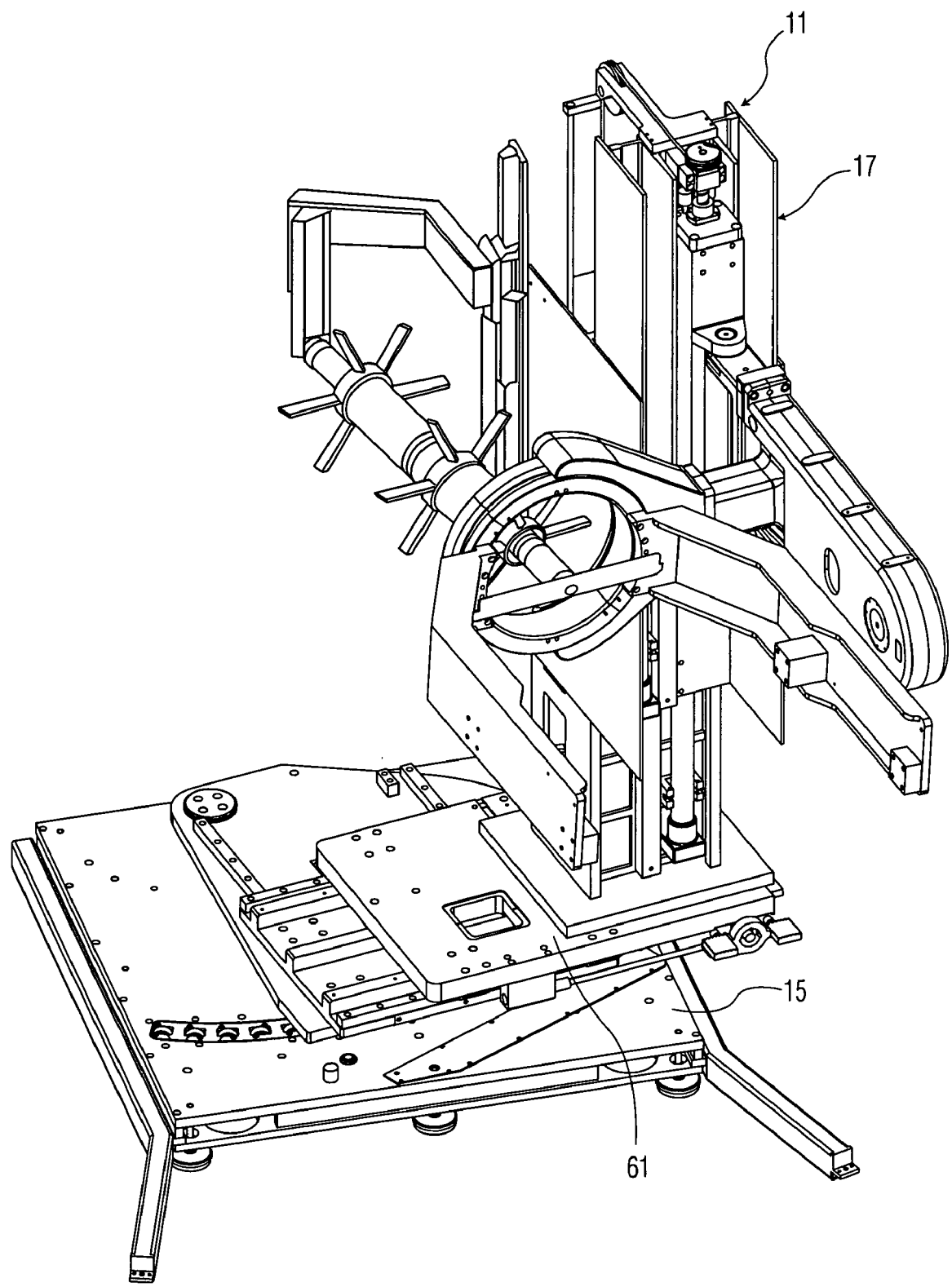

FIGS. 5A through 5C are perspective drawings of the test head positioner 11 and illustrate the interaction of all of the manipulator axes of FIG. 2. The positioner permits movement in all six degrees of freedom. FIG. 5A shows the base 15 with an upper platform 61 rotated 30 degrees clockwise and the column 17 pushed all the way back and all the way to the left. FIG. 5B shows the base 15 with the upper platform 61 in a straight-ahead alignment with the column 17 at mid-stroke in both in-out and side-to-side axes. FIG. 5C shows the base 15 with the upper platform 61 rotated 10 degrees counterclockwise with the column 17 positioned all the way forward and all the way to the right. It is seen that all axes may be individually controlled or that all may be moved simultaneously as is generally needed in docking.

Referring again to FIG. 1, the telescoping column 17 is mounted to the base 15 and is comprised of the three vertical segments 21, 22, 23, and these segments 21, 22, 23 are approximately equal in length. The length of each vertical segment 21, 22, 23 is approximately four feet (120 cm). This provides a height of approximately four feet above the top of the base 15, when the column is fully retracted, and approximately eight feet (240 cm) above the top of the base 15, when it is fully extended. The vertical structure is not necessarily limited to three segments 21, 22, 23; fewer or greater numbers of segments could be utilized according to needs and available technology. The three segments 21, 22, 23 in this example all have "H" cross sections for stiffness, with the uppermost section 23 having additional vertical fins for additional stiffness. Other cross sections could also be used; for example, the nestable cross section utilized in U.S. Pat. No. 5,931,048, to Slocum et al. and referenced above. The three segments are as follows:

Main (or first or bottom) segment 21—fixed to the base 15.

Second (or middle) segment 22—slides up and down the main segment 21 by means of linear guide rails 81 (not shown in FIG. 1) attached to the main segment 21 engaged by mating ball slides 83 (not shown in FIG. 1, see FIG. 12) attached to the second segment 22.

Third (or upper) segment 23—slides along the second segment 22 by means of linear guide rails 81 (not shown in FIG. 1) attached to the second segment 22 engaged by mating ball slides 83 (not shown in FIG. 1, see FIG. 12) attached to the third segment 23. This segment also functions as the vertical support arm 25.

The three vertical segments 21, 22, 23 are arranged so that motor-driven linear actuators 75, one for each moving segment, can raise and lower the top of the column 17. The linear actuators 75 are coupled to standard trunions 76 (one of two shown in FIG. 1, see also FIGS. 10A and 10B). Actuators having ball screws are preferred; however, other screw types, such as an ACME screw, could alternatively be used depending upon cost, availability, speed variables and power requirements. The first such linear actuator 75 moves the second segment 22 with respect to the main segment 21. The second such linear actuator 75 moves the third segment 23 with respect to the second segment 22. The second 22 and third 23 segments move in proportion such that a total vertical motion is made up of 50% motion of the second segment 22 with respect to the first 21 and 50% motion of the third 23 with respect to the second 22.

A standard Saginaw linear actuator 75 is typically utilized. This unit provides a maximum extension of 24 inches (61 cm). The two actuators 75 together provide a total vertical travel of 48 inches (122 cm), and it is observed that each of the movable segments 21, 22, 23 moves approximately one-half its length with respect to the segment that is immediately below it. Thus at full extension there remains an approximate 50% overlap between adjacent segments which helps to maintain structural rigidity. In a preferred embodiment each actuator 75 has a speed of approximately 0.4 inches/second (1 cm/sec) to provide a combined vertical speed of approximately 0.8 inches per second (2 cm/sec) or 4 feet/minute. The combination of two standard off-the-shelf actuators 75 together with two movable segments provides the most economical overall solution providing 48 inches (120 cm) of vertical travel. Should other actuators with different ranges become available at reasonable costs, then the economics may suggest a different number of movable segments to achieve the same result.

In contrast to many other contemporary manipulators, this main vertical motion is typically powered; there are no associated counterbalancing mechanisms. The linear actuators 75 are responsible for fully supporting the entire system load (previously defined) regardless of whether the actuators 75 are energized to either raise or lower the load or whether power to the actuators 75 has been turned off. Accordingly, the thread pitch angle of the linear actuators 75 is chosen to prevent back driving; i.e., so that if a motor is disabled or removed, the load will stay at a fixed vertical position and not fall. No mechanical brakes or locks are required. The actuators 75 are therefore considered to be non-compliant drives. The ultimate static load rating of the mechanisms is chosen with a safety factor greater than three so that structural integrity is maintained in all situations.

Figure 6:
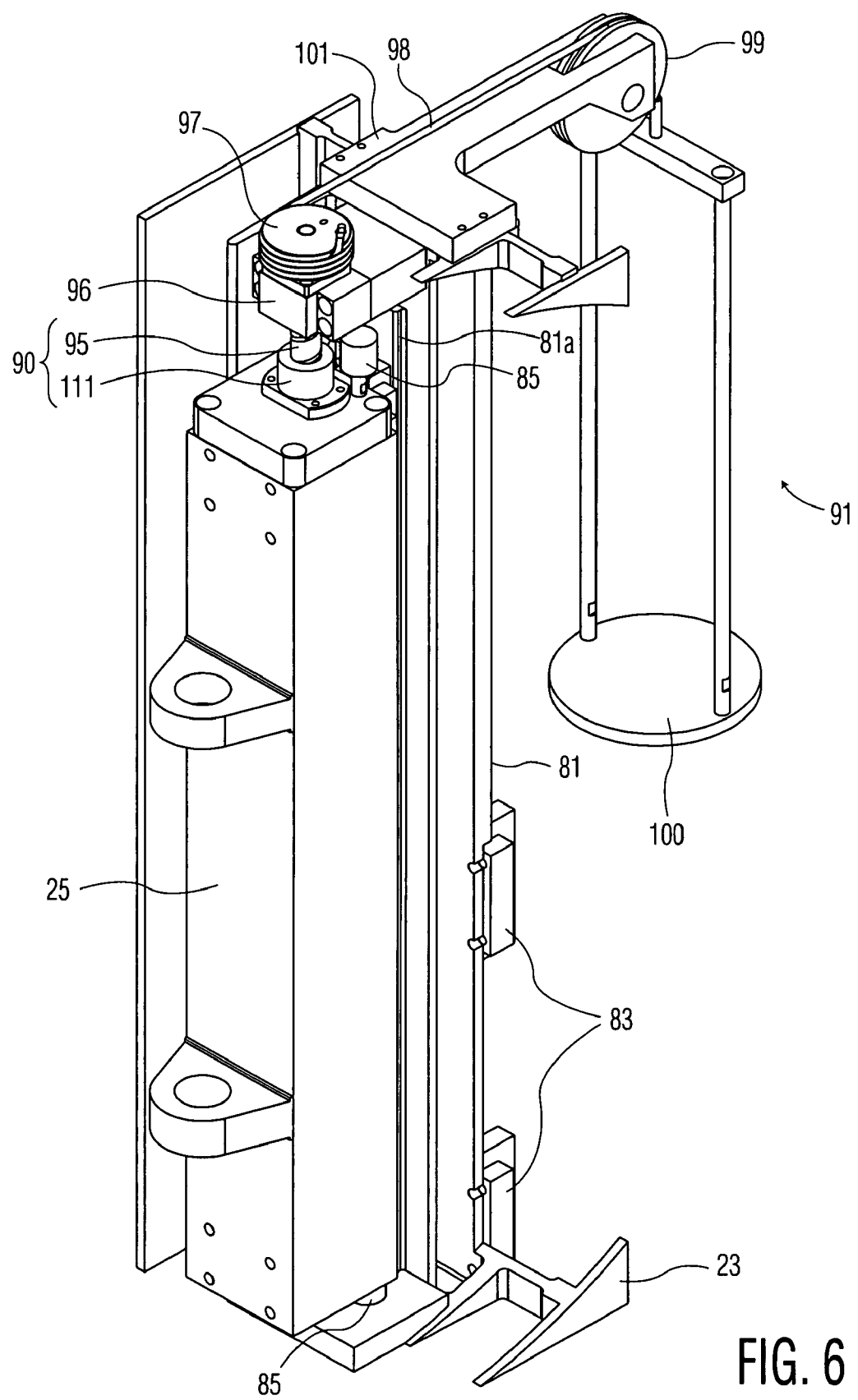
FIG. 6 is a cut-away perspective illustration showing a vernier adjustment for vertical motion in a main arm according to an exemplary embodiment of the present invention.

FIG. 6 is a cut-away perspective illustration and shows details of the main arm 25 and the use of vernier vertical motion. As shown, the main arm 25 is slidingly attached to the third segment 23 (vertical arm support) using linear guide rails 81a that are attached to the vertical arm support 23 and that are engaged by mating ball slides 83a (not visible in FIG. 6, see FIGS. 7a through 7c) attached in turn to the main arm 25. Third segment 23 attaches to second segment (not shown) by means of linear guide rails 81 and linear bearing blocks 83. Resilient bumpers 85 are attached at the upper and lower ends of the main arm 25. These bumpers 85 contact structural elements of the vertical arm support 23 in a manner to restrict the vertical motion of the main arm 25 to approximately plus or minus one inch (2.5 cm) with respect to the vertical arm support 23 for docking and undocking. This provides a vertical vernier motion that is fully independent of the main vertical motion provided by the previously described linear actuators 75.

The main-arm vernier vertical motion is relative to the third segment or vertical arm support 23. It is fully balanced to enable smooth docking and undocking and to absorb motion and vibration during testing. Balance is achieved using a vertical counter weight mechanism 91 with a mechanical advantage (MA) greater than one. Typically, the mechanical advantage is 10. This embodiment achieves this using a low friction ball screw mechanism 90 having a 20 mm×20 mm (or similar) thread pitch angle to allow low-friction, free motion in either direction. This permits the main arm 25 to be readily back driven without undue force. Ball screws are well known as being efficient devices to provide linear motion with mechanical advantage. An upper end of the ball screw 95 is mounted to the upper end 96 of the vertical arm support 23 using a support unit comprising an appropriately sized contact ball screw support bearing assembly 103 (not shown in FIG. 6, see FIGS. 7A-7C), in which the ball screw 95 is free to rotate. The ball screw shaft extends upwards through the bearing, and a cable drum 97 is coaxially and rigidly attached to the ball screw 95 so that the ball screw 95 and drum 97 rotate in unison. The top of the cable drum 97 is above the top of the vertical arm support 23. The ball screw 95 is used to effect motion of main arm 25 by driving the main arm 25, but it should be noted that the ball screw 95 is a driven mechanism in the sense that the counterweights (not shown) drive the ball screw 95, and the main arm 25 back-drives the ball screw 95.

One end of a cable 98 is fixed to the cable drum 97. The cable 98 is wound around the drum 97, extends over the top of the vertical arm support 23, and is led towards the rear of the manipulator 11. The cable then passes over a sheave 99 attached to a bracket 101 mounted on top of the vertical arm support 23. The cable 98 then extends downwards from the sheave 99 and connects to and supports a weight holder 100 that contains an appropriate amount of counter weights (not shown). The cable drum 97 is provided with a helical grove in which the cable 98 rides to prevent the cable from overriding itself and causing the system to jam.

A ball screw nut 111 having mating threads to the ball screw 95 is attached with machine screws to the upper end of the main arm 25. The ball screw 95 is threaded through this nut 111. The ball screw 95 supports the main arm 25 and its entire load. As the main arm 25 moves vertically with respect to the vertical arm support 23, the motion of the ball screw 95 through the nut 111 will cause the ball screw 95 to rotate along its axis. As the ball screw 95 rotates, the cable drum 97 will turn and the counter weights (on weight holder 100) will be raised or lowered. It is seen that the bearing assembly that attaches the ball screw 95 to the vertical arm support 23 must both bear the full axial load applied by the main arm 25 and allow low friction rotation of the ball screw 95. Commercially available ball screw support bearings are employed for this function.

As mentioned, a mechanical advantage (MA) greater than one is typically provided. Neglecting friction, the mechanical advantage is determined by the formula:

$$MA = \pi \cdot D \cdot P$$

Where: D is the effective diameter of the drum 97,

And P is the ball screw pitch in turns per unit length (Note: units of length used in both quantities must be the same)

The counter weights weigh 1/MA (10% with MA=10) of the combined weights of the test head (not shown), main arm 25 and interconnecting manipulator structure, and the test head's share of the telescopic cable support and cable. The counter weights move MA times the distance of the main arm motion with respect to the third segment 23 (i.e., approximately +/−10 units for each one unit with MA=10). Because there is very little friction in the system, the main arm 25 behaves as if it were directly counterbalanced with a simple cable and pulley arrangement as first described for example in U.S. Pat. No. 4,527,942.

Figure 7A:
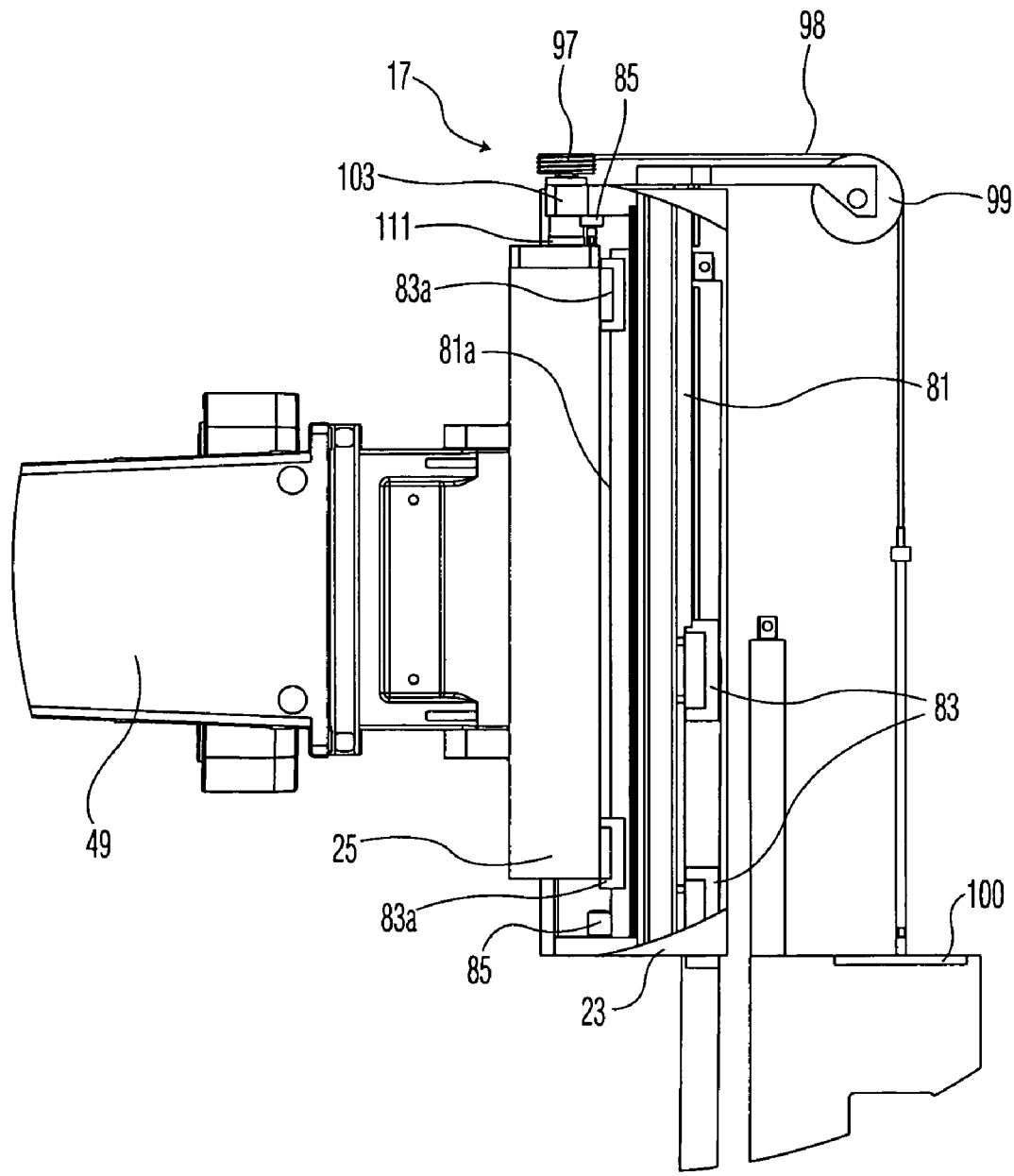
FIGS. 7A, 7B and 7C are face views of the upper portion of the manipulator column showing the main arm in its uppermost position, and intermediate position, and lowest position respectively.
Figure 7B:
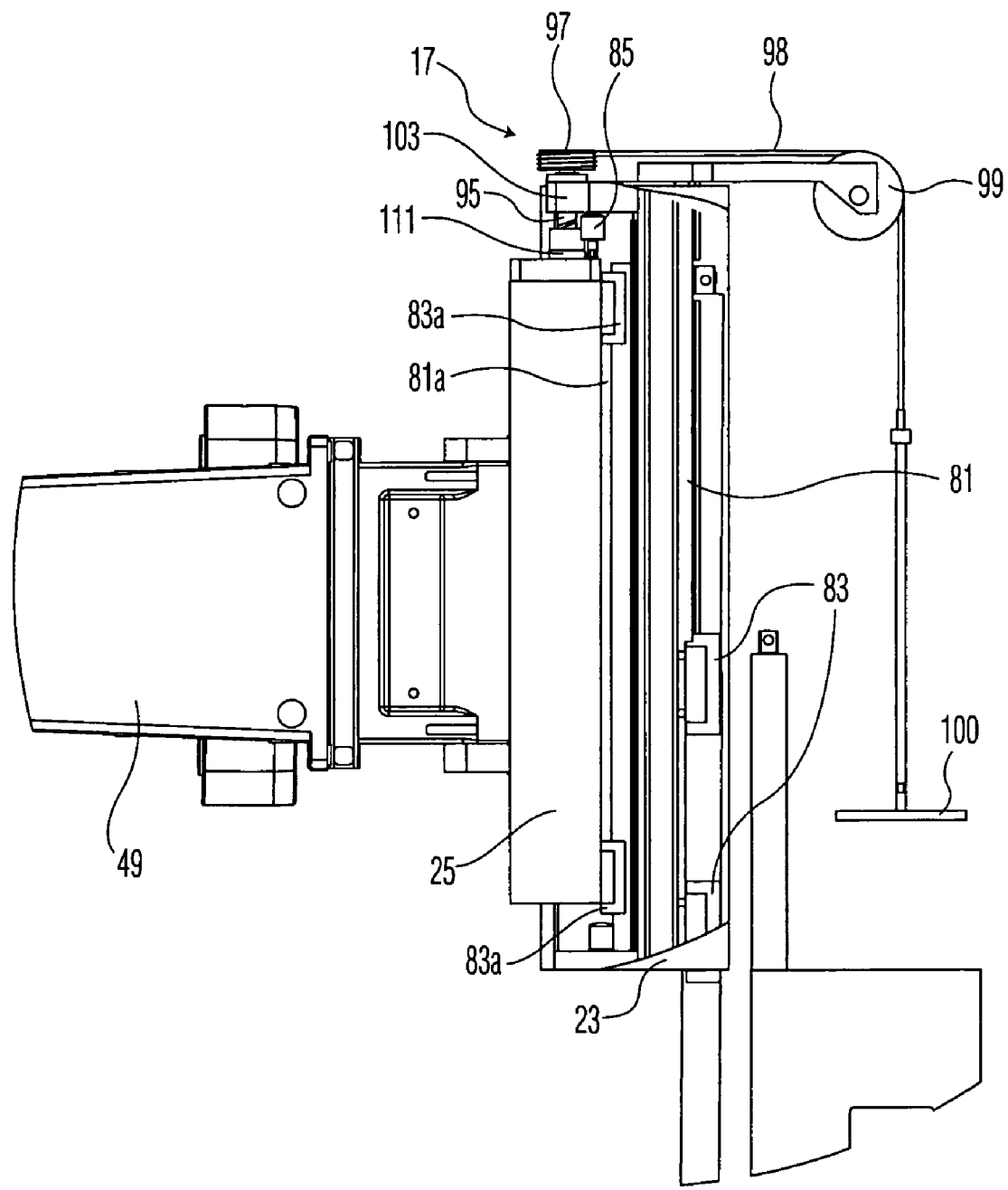
Figure 7C:
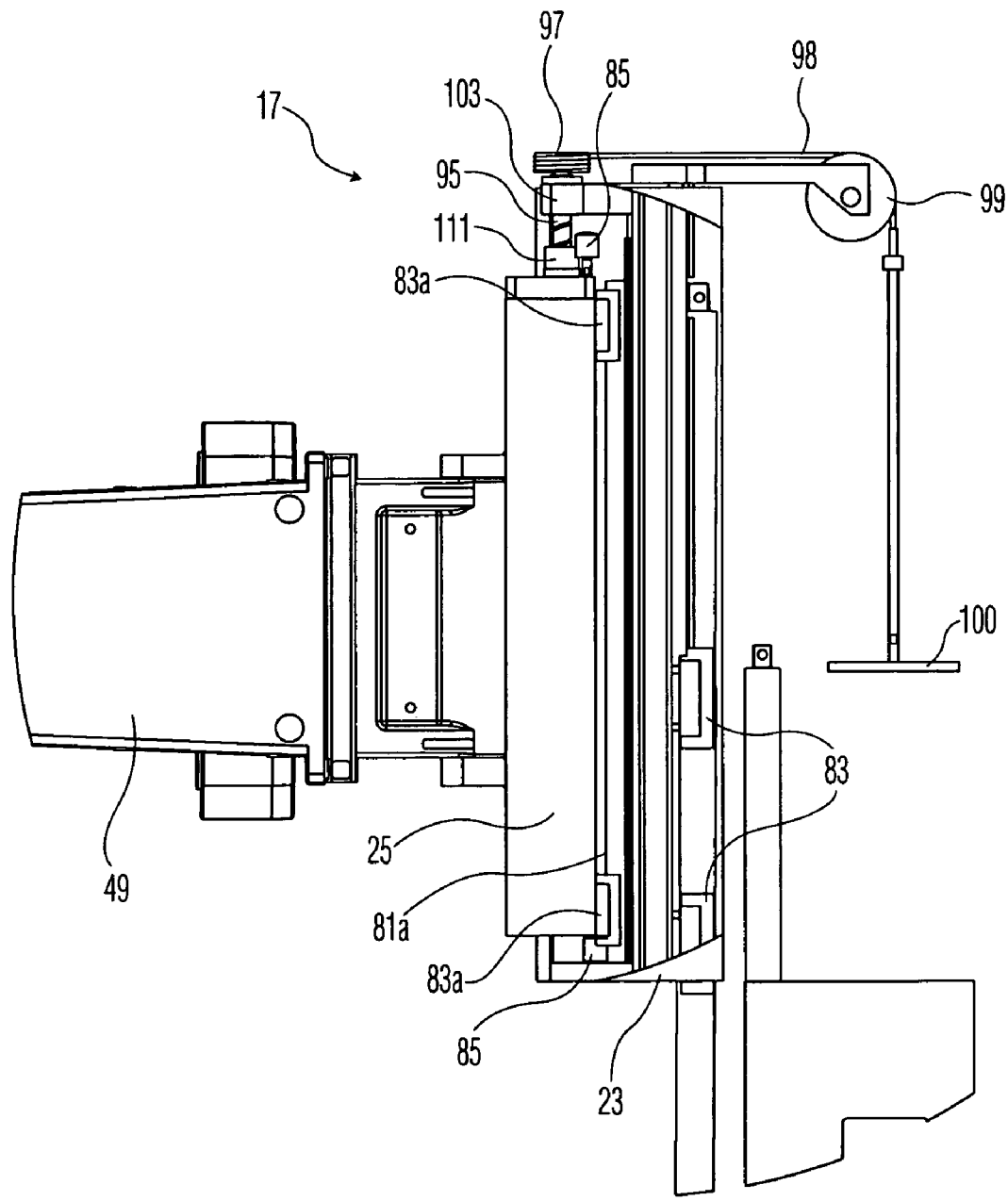

FIGS. 7A, 7B and 7C are cross sectional views of the upper portion of the manipulator column 17 showing the main arm 25 in its uppermost position, and intermediate position, and lowest position respectively. These serve to illustrate the relative motions of the main arm 25, ball screw 95, and counter weights (weight holder 100). In FIGS. 7A-7C, the ball screw support bearing assembly 103 is also shown. In each of FIGS. 7A-7C, the upper segment 23 is cut away and the middle segment 22 is not shown to illustrate operation of the main arm counterbalance mechanism.

Figure 9:
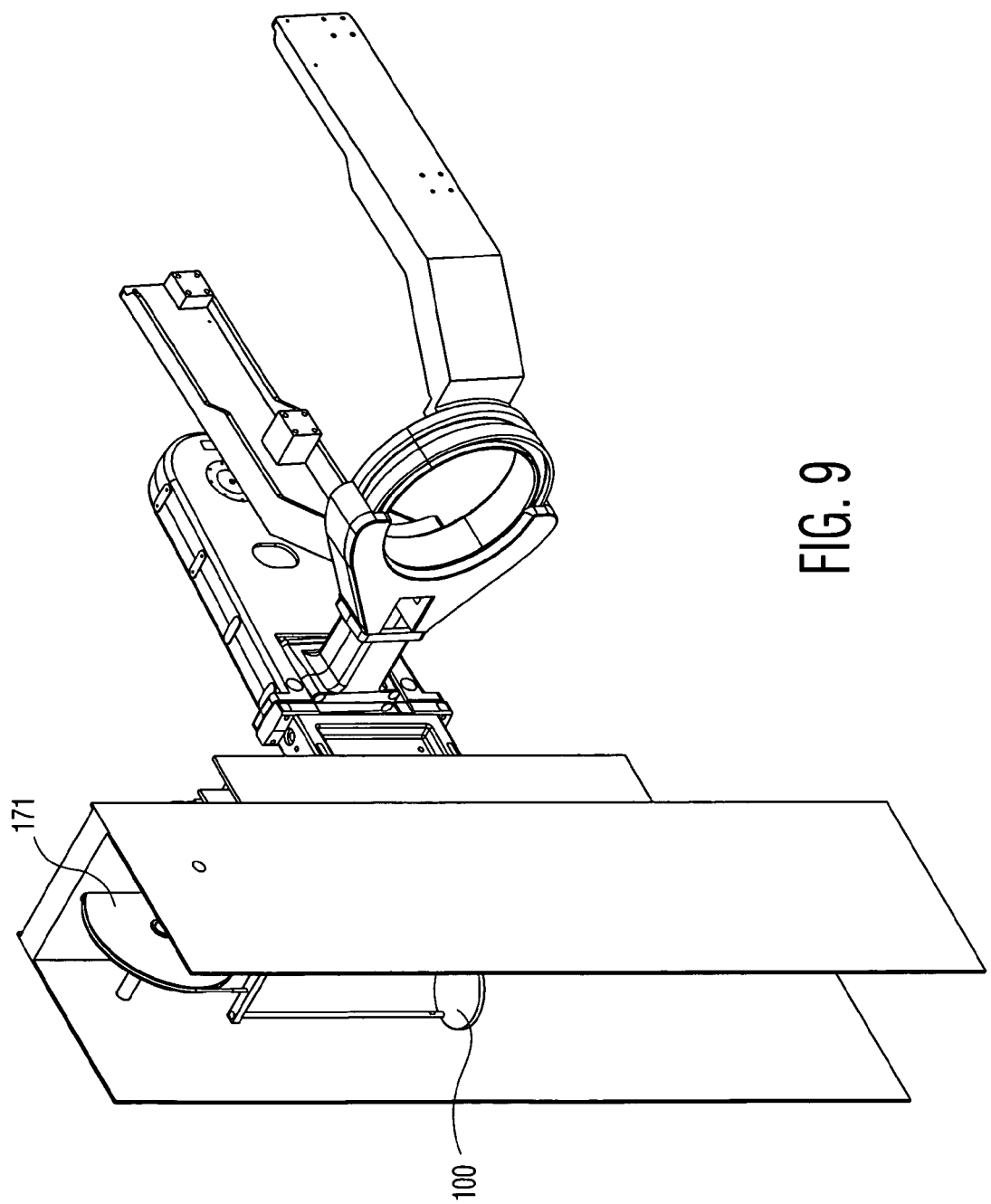
FIG. 9 is a rear perspective view depicting the non-telescoping exemplary embodiment of the positioning system of FIG. 8.

FIGS. 8 and 9 are views depicting a non-telescoping embodiment of a positioning system constructed according to one aspect of the present invention. The arrangement previously described may also be applied to the positioning system in which a fixed height column is used. In prior art manipulators having a fixed height column, the main arm slides along rails or one or more shafts supported by the column; typically the main arm and its load are fully counterweighted, so that little force is required to move the test head over the full range of vertical motion. The total weight of the counterweights is approximately equal to the weight of the system load (i.e., the main arm and everything supported by it including the test head). The present invention can be adapted to allow the total weight of the counterweights to be approximately equal to the system load divided by the mechanical advantage MA.

In FIGS. 8 and 9, a fixed height column manipulator 141 is shown without a base. The manipulator 141 has a column 143 which may be mounted on either a fixed base or on a base that provides horizontal motion in selected axes, both approaches being known and having been described in earlier patents and disclosures. Additionally, the fixed column 143 may be a stationary column extending between and being attached to floor and ceiling.

A vertical arm support 145 is slidingly coupled to the column 143 using, preferably, linear guide rails 147 fixed to the column 143 engaged by ball slides (not shown) attached to the vertical arm support 145. A linear actuator 75 (not shown) is used to drive the vertical arm 145 vertically along the column 143.

A main arm 155 of the manipulator 141 is slidingly coupled to the vertical arm support 145 in a similar manner as with the telescoping column manipulator 11. A similar ball screw mechanism 161 is utilized in a similar manner to provide a balanced vernier vertical motion and to reduce the amount of counter weights required. In this embodiment, a cable 165 supporting the counter weights is treated somewhat differently. In particular, the cable 165 is first led from a cable drum 167 and passed under a sheave 169 that is fixed to the upper end of the vertical arm support 145. The cable 165 then extends toward the top of the column 143 and passed over a sheave 171 that is fixed to the top of the column 143. The cable 165 is then led down the rear of the column 143 where it is attached to a weight holder 100 that holds the counter weights (not shown).

It is apparent that as the vertical arm support 145 is driven up and down the front of the manipulator column 143, the counter weights will fall and rise along the rear of the column 143. The total travel of the counter weights will be nominally equal to the distance traveled by the vertical arm 145 support plus or minus the mechanical advantage, MA, multiplied by the travel of the main arm 155 with respect to the vertical arm support 145. The physical height of the counter weights, the diameters and locations of the sheaves 169, 171, and the space required by the physical extension available in the linear actuator 75 will all impose limits on the total available vertical motion available in a manipulator of a given fixed height.

Figure 10A:
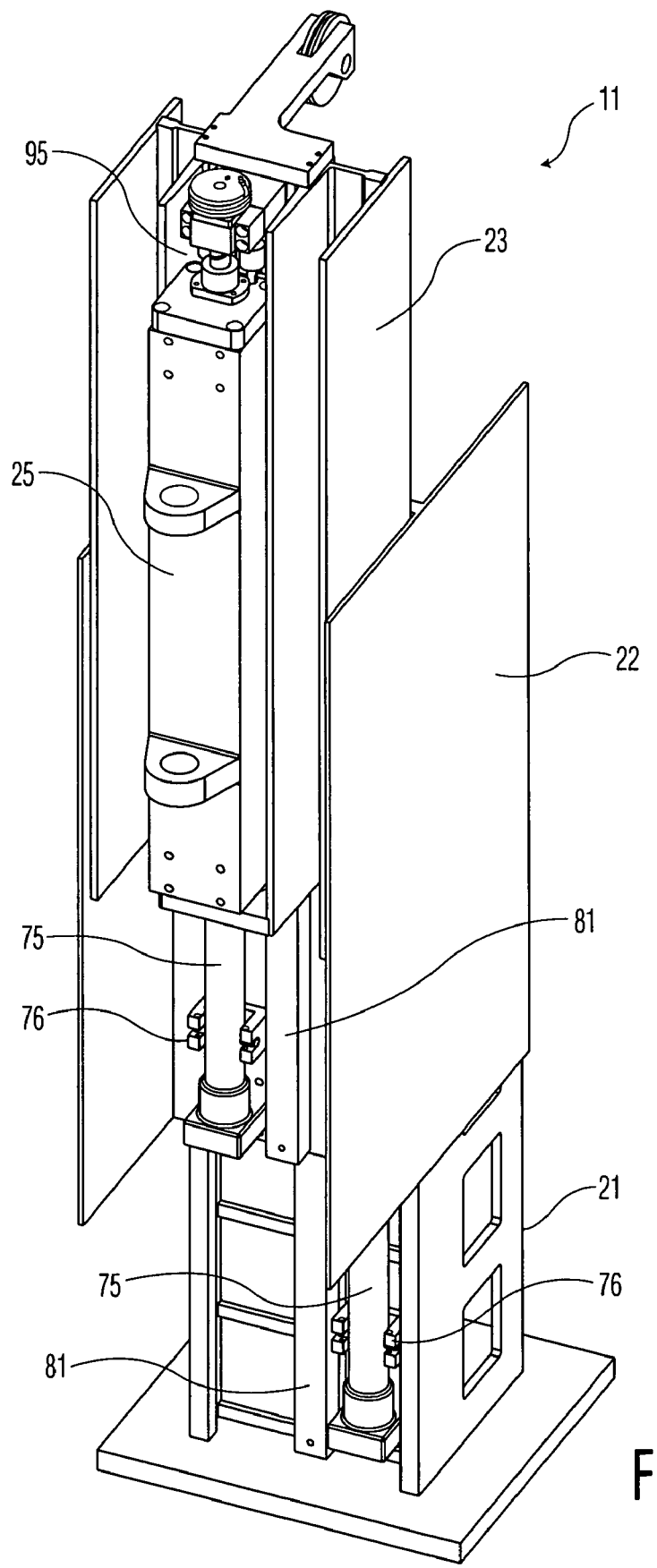
FIG. 10A is a perspective view of the front of a telescoping column assembly constructed according to an exemplary embodiment of the present invention.
Figure 10B:
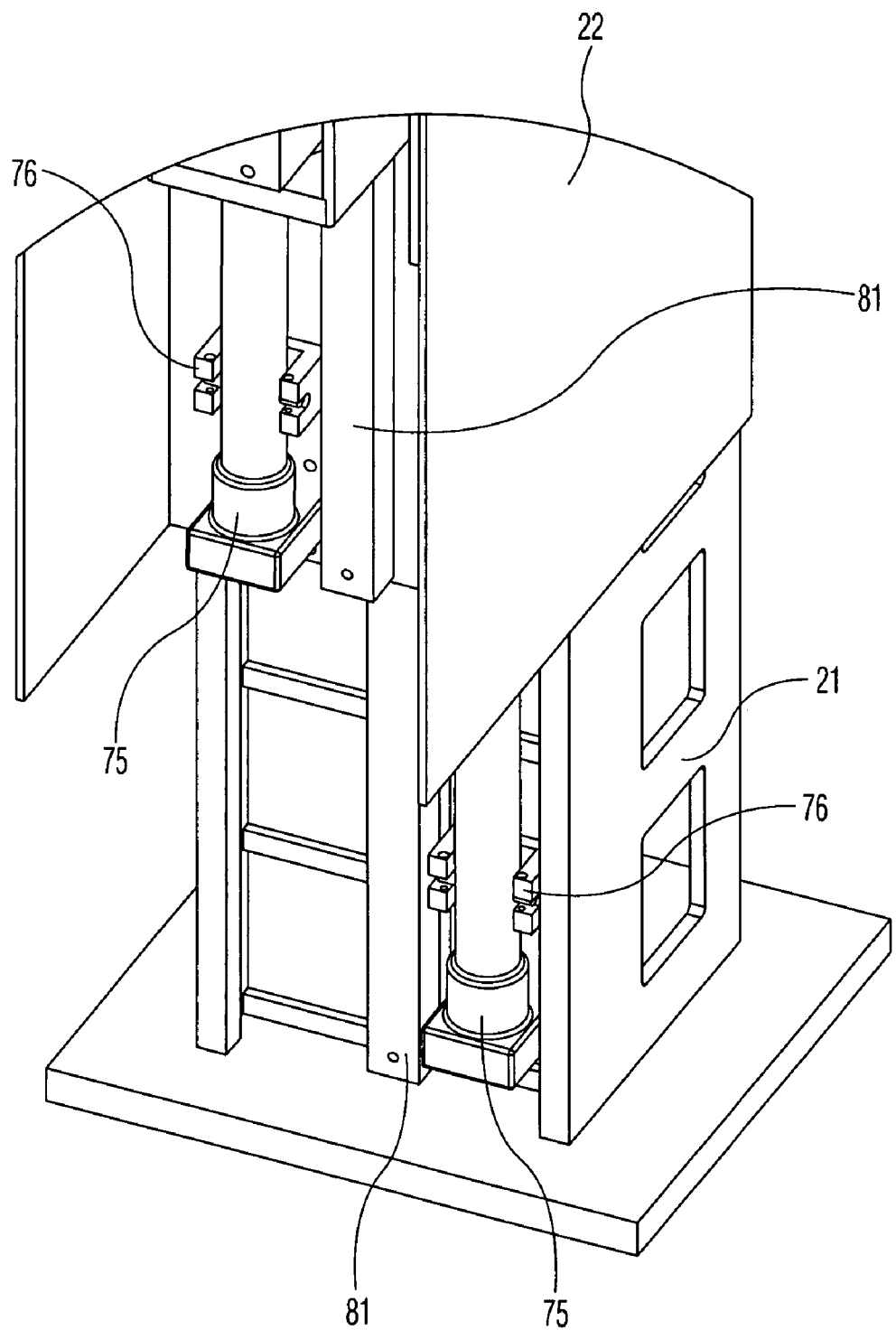
FIG. 10B shows details of the front of the telescoping column assembly of FIG. 10A.
Figure 11A:
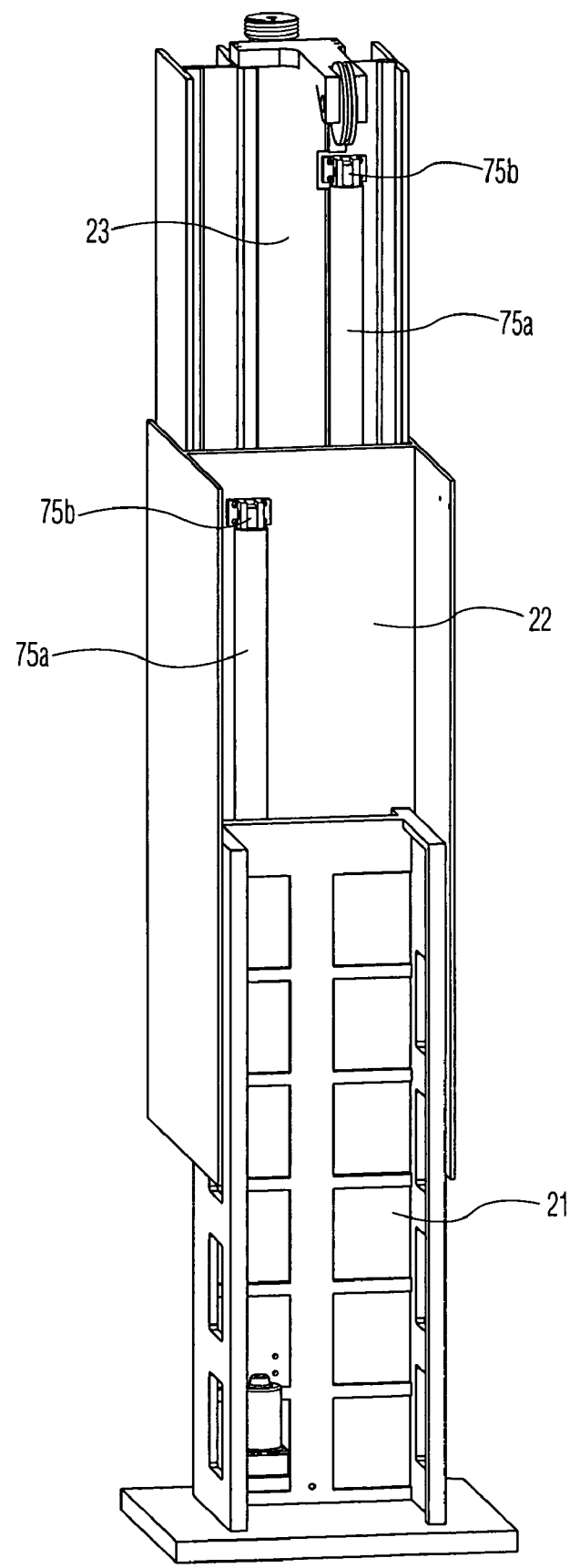
FIG. 11A is a perspective view of the back of the telescoping column assembly of FIGS. 10A and 10B.
Figure 11B:
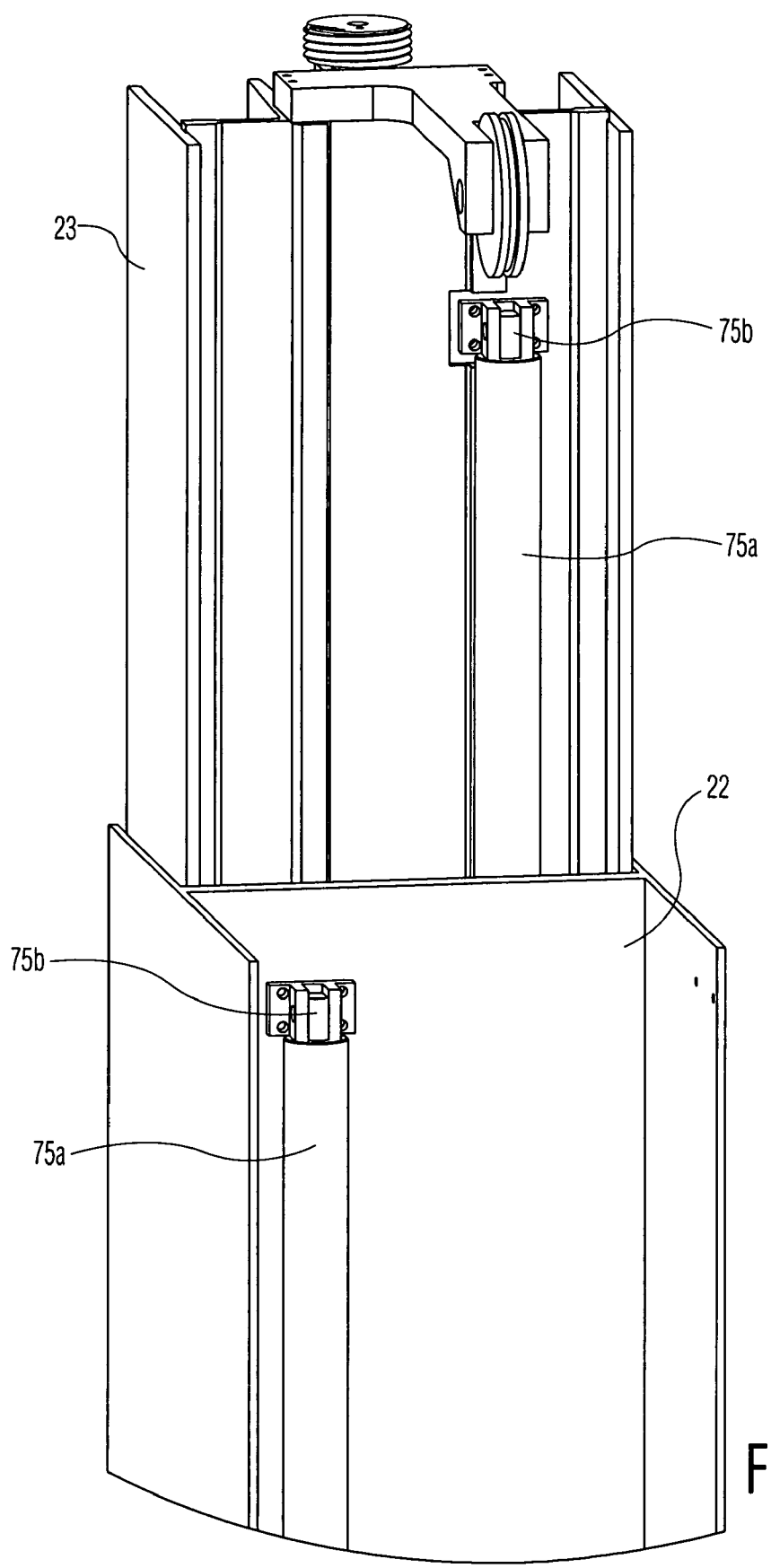
FIG. 11B shows details of the rear of the telescoping column assembly of FIG. 11A.
Figure 12:
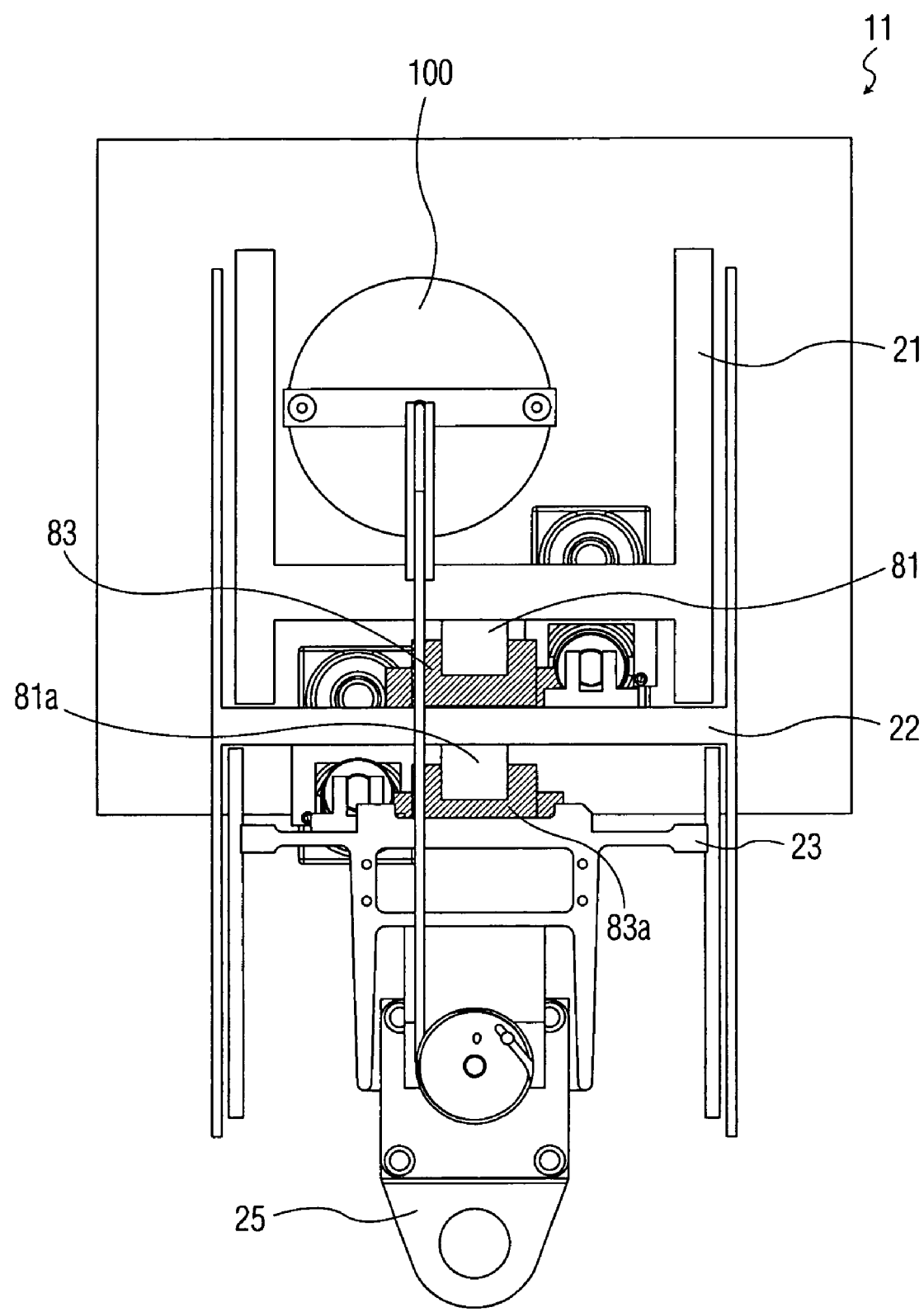
FIG. 12 is a plan view of the telescoping column assembly of FIGS. 10-11.
Figure 13:
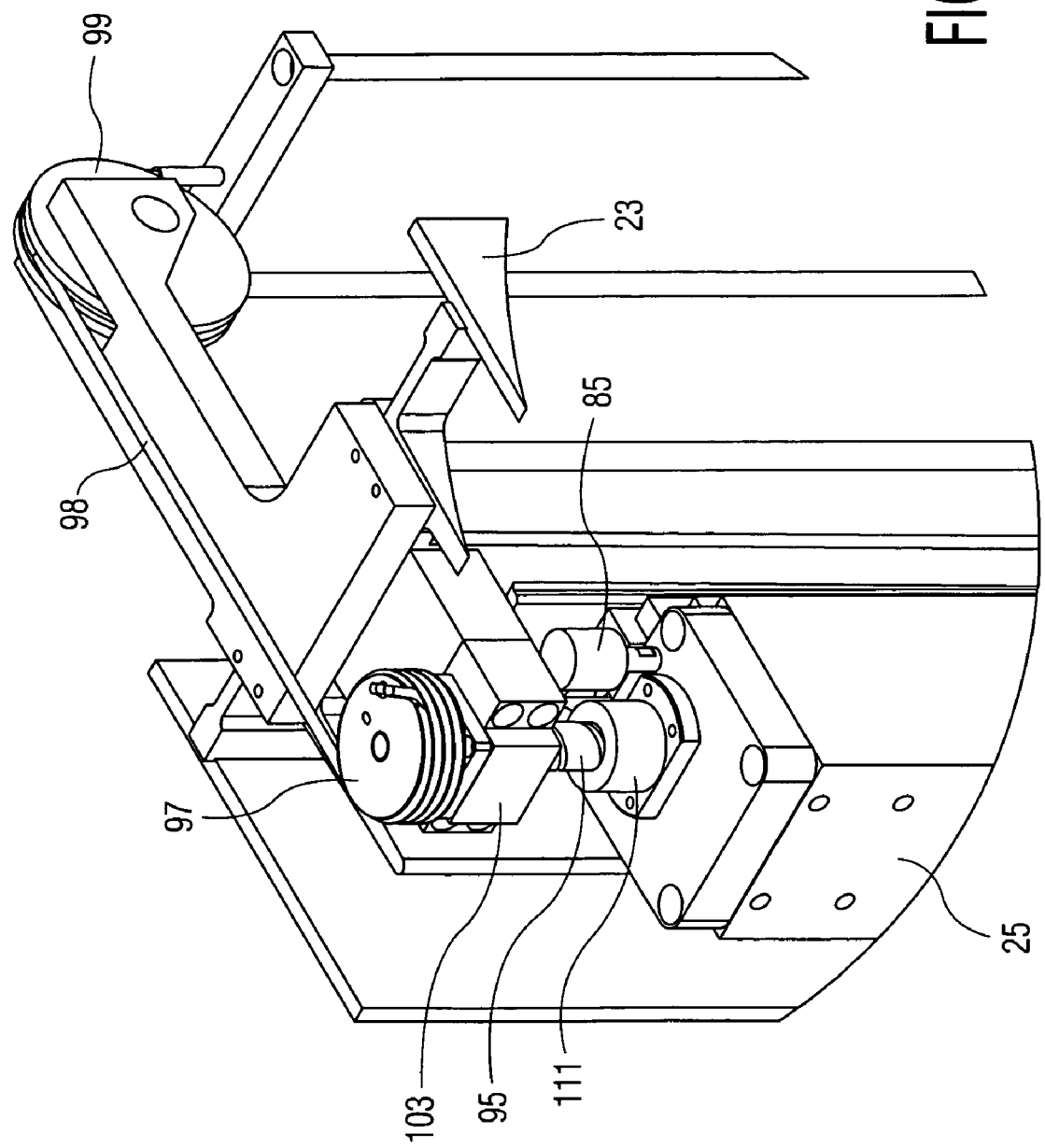
FIG. 13 is a top perspective view of the telescoping column assembly of FIGS. 10-12.

FIGS. 10A-13 are different views of a telescoping positioner 11 constructed according to the present invention. The views illustrate the relative motions of the main arm 25, ball screw 95, and counter weights (weight holder 100). FIGS. 10A and 10B are perspective views of the front of a telescoping column assembly 11. FIGS. 11A and 11B are perspective views of the back of the telescoping column assembly 11. FIGS. 11A and 11B provide a view of the screw 75a of the linear actuator 75, with one end of the screw 75a coupled to fork 75b. FIG. 12 is a plan view of the telescoping column assembly 11 and FIG. 13 is a top perspective view of the telescoping column assembly 11.

Safety features and system control features can be used in both the telescoping column and fixed height column embodiments. The vertical vernier axis is powered in a manner similar to that disclosed in U.S. Patent Application Serial No. PCT/US00/00704. A dc motor is combined with an appropriate gear box, clutch, and drive mechanism to apply power to the ball screw cable sheave in the case of the telescoping column manipulator and to either the ball screw cable sheave or the column cable sheave in the case of the fixed height manipulator. The clutch is only engaged when it is desired to use the motor to drive the vertical vernier axis, at all other times this axis is free to move relative to the vertical support arm by the application of any external forces.

The current applied to the dc motor is typically limited to a fixed value to limit the motor torque to a level sufficient to slightly overcome friction and allow motion. If obstacles or significant external forces are encountered, the motor will safely stall.

There are two cases of external forces:

1) During docking and undocking the vernier vertical axis must be free to move due to the forces applied by the docking actuator. While docked, the vernier vertical axis should be free to move to absorb vibrations due to the handler, prober or other test station apparatus (TSA) operation.

2) When not docked, or in the process of being either docked or undocked, any non-driven vertical vernier motion is a sign that external forces have been applied and/or an obstacle has been encountered in positioning the test head vertically. Generally, these may be taken as unsafe or hazardous conditions.

Accordingly, a means for sensing relative motion between the main arm 25 and the vertical arm support 23 is provided. The output of this sensor provides a useful signal for both control and safety. Additionally, sensors are employed to sense the relative position of the main arm 25 with respect to the vertical arm support 23. A variety of sensor types can be used according to the sophistication of the overall control system that is to be used with the manipulator 11. For example an absolute encoder that provides precise position information could be utilized in a system having a high degree of automation. The output of such an encoder may be readily differentiated in a data processing unit to provide motion detection. In a simpler system, one or more limit switches may be used to detect certain relative positions and a simple photoelectric or other device could be utilized to detect relative motion.

A most basic system is now described to illustrate the safety features incorporated in the invention. Those skilled in the art will readily apply these features to more sophisticated systems. In this basic system limit switches and limit switch actuators are used in known ways to provide the following binary-valued signals:

Main Arm Up (MAU): true when the main arm 25 is in the upper half of its range of relative travel. That is, it is true from approximately the center of travel through the upper limit of travel.

Main Arm Centered (MAC): true when the main arm 25 is in the central region of its range of relative travel. Typically, for reasons discussed below, when the main arm 25 is approximately within plus or minus $\frac{1}{8}$ to $\frac{1}{4}$ of an inch of being exactly centered.

Main Arm Down (MAD): true when the main arm 25 is in the lower half of its range of relative travel.

In addition there is a motion sensor that provides a signal whenever relative motion occurs. In the present system an incremental shaft encoder having a resolution of 1024 parts per revolution (such as a Hohner Corporation Series 01 encoder) is coupled to the cable sheave 99. If the sheave 99 has a six-inch diameter and if the ball screw mechanism 90 provides a mechanical advantage of ten, then the incremental encoder will detect a relative motion change of approximately 0.018 inches. The encoder output may be readily connected to electronic circuitry to provide a pulse whenever such an increment motion is detected. To achieve a coarser resolution, a digital counter circuit can divide the train of pulses appropriately.

There are two modes of operation in a basic system: a "normal" mode and a "maintenance" mode. A key operated switch is provided and arranged so that the system is in normal mode when the key is not inserted in the switch. A skilled operator, who possesses a key, may insert the key and switch the system to maintenance mode when necessary. Those skilled in the art will recognize that there are other methods that could be implemented to ensure that only qualified, skilled personnel are able to place the system in maintenance mode.

In normal mode the safety features to be described are enabled allowing a person of relatively low skills and experience to operate the system. Maintenance mode is provided to help a skilled, qualified operator clear the system from the effects of obstructions, collisions, or other unsafe situations and also to enable system maintenance, repair, and set-up operations where balanced motion might not always be available or possible.

A handheld control unit is provided that has (in addition to other possible controls not pertinent to the present invention) a three-position momentary on-off-on switch to control the major vertical motion. One of the on positions is used to request the linear actuators 75 to move the vertical arm support 23 in the up direction. The other on position requests the linear actuators 75 to move the vertical arm support 23 in the down direction. In either maintenance or normal mode, vertical motion will always stop whenever the operator control is released, whereupon it reverts to the off position.

In maintenance mode, the vertical arm support actuators 75 will always be energized in response to the motion request. It is up to the skilled operator to ensure safety of operation.

In normal mode safety features are enabled, and these are now described in the following paragraphs.

Before either up or down motion can begin in normal mode, it is required that the main arm 25 be in a position where it can detect an abnormal condition effecting motion. There are several possible simple control embodiments. Two are described herein, and others will be apparent to those skilled in the field. In the first embodiment, if MAC is true, signifying that the main arm 25 is in the "central region" of its range of relative travel, when either up or down motion is requested, then power is appropriately applied to the vertical actuators 75 and the requested motion commences. If MAC is false when the operator actuates either the up control or the down control, the system will automatically attempt to center the main arm 25. In particular if MAU is true, the system will use the vernier vertical drive motor and clutch to drive the main arm 25 in the down direction until MAU switches to false. At this point the main arm 25 will be very nearly in the center of the central region. Vertical arm support motion is then allowed to begin. Similarly, if MAD is true, the system will drive the main arm 25 in the up direction until MAD switches to false where the main arm 25 will be very nearly in the center of the central region. Vertical arm support motion is then allowed to begin.

In the second embodiment, it is reasonably assumed that if an obstruction is encountered during vertical motion, it will cause the main arm 25 to move in the opposite direction of the requested motion. For example, an obstruction encountered while moving in the up direction will cause a downwards relative motion of the main arm 25 relative to the vertical arm support 23. In this embodiment Up (Down) vertical motion is allowed if either MAU (MAD) or MAC are true when the up motion is requested. If neither is true, then MAD (MAU) is necessarily true and the main arm 25 is driven up with respect to the vertical arm support 23 until MAD (MAU) becomes false, indicating that the main arm 25 is centered with respect to the vertical arm support 23. As stated previously, the manipulator 11 can be configured so that vertical motion always halts whenever the operator control is released.

In either embodiment, whenever the system begins to automatically center the main arm 25, a timer can be started. The timer is stopped when the main arm 25 arrives at its centered position. If an obstacle, obstruction, or other malfunction prevents the main arm 25 from becoming centered within a predetermined amount of time, the timer gives an output signal that shuts off the power sources to all drive mechanisms and alerts the operator to the situation. The power sources to the drive mechanisms must be manually turned back on by a skilled, qualified operator after the situation has been fixed. It may be necessary for the skilled, qualified operator to utilize maintenance mode to clear the situation. A key-operated switch or other secure means may also be readily employed to restore the power to the actuators 75 for increased safety.

Because the vertical vernier axis is in a balanced condition, very little external force, typically less than 15 kg, is needed to cause relative motion between the main arm 25 and the vertical arm support 23. When the linear actuators 75 are driving the vertical arm support 23 in either the up or down directions, the vertical vernier axis will remain in its balanced condition; and no relative vertical motion of the main arm 25 with respect to the vertical arm support 23 should occur. If an obstacle or obstruction is encountered and struck by the system load, the force so applied to the main arm 25 will cause relative motion that will be detected by the motion detector. Such an event could be a potentially hazardous one, threatening life, bodily injury, and/or expensive damage to equipment. Accordingly, just as in the above case, to prevent or at least minimize harm, the power sources to all drive mechanisms are immediately turned off and the operator is alerted to the situation. The power sources to the drive mechanisms must be manually turned back on by a skilled, qualified operator after the situation has been fixed. A key-operated switch or other secure means may be readily employed to restore the power to the actuators 75 for increased safety. In addition the skilled, qualified operator may use maintenance mode in rectifying the problem.

Because this is a basic system, there exists the possibility of operator errors leading to a collision. Suppose, for example, the test head has just been undocked from a wafer prober, and it is desired to move the test head up and away from the prober. A careless operator might activate the down control instead of the proper up control by mistake. The test head would then move into the dock, a collision would begin causing relative motion that would be detected, and all power would be removed from all drive motors. It is noted that a more sophisticated system might use sensors and control means to prevent such an event. In general it is not likely that a control system can be reasonably designed to detect and prevent all potentially hazardous situations, and any system design must take such an eventuality into account.

In recovering from a situation such as the above or in removing an obstacle that was accidentally encountered, either having caused the power to the linear actuators 75 to be shut off, a skilled operator may find it desirable to use the vertical power drive in normal mode to move the system load away from the obstruction. That is, to move the main arm 25 in the opposite direction of the original motion that caused the collision. It is possible that the system may be in a situation where main arm 25 has moved away from the original centered position and the obstruction would prevent the main arm 25 from becoming automatically centered as described earlier. Because the "central region" of relative motion has been defined to be fairly large (⅛ to ¼ inch overall), the repair operator may be able to manually adjust the position of the main arm 25 to a point where the conditions to allow motion without first centering are true (even though the main arm 25 is somewhat off center). With the actuator power sources turned back on, this will enable the use of the linear actuators 75 to move the system load away from the obstacle. Once the system has been moved one or two inches away from the obstruction, the operator may, if he or she so wishes, stop the motion, manually adjust the main arm 25 to a position away from the central region causing MAC to become false, and then restart motion. This will enable the main arm 25 to be automatically centered by the normal operating process. In the scenario just described, the skilled operator has avoided the use of the maintenance mode and has advantageously kept the safety mechanisms enabled.

Another aspect of the system concerns the threshold for detecting relative motion. Ideally, when the linear actuators 75 are driving the vertical arm support 23 up or down, no relative motion with respect to the main arm 25 will take place as the system is balanced; however, some small amount of motion may be experienced upon starting and stopping. Further, due to system degradation with use, some relative motion "chatter" may be experienced. These factors set a minimum amount of motion, or motion noise level, that must be tolerated. As described earlier, the use of a simple incremental encoder as a motion detector enables the system to be constructed in a fashion to allow electronic adjustments in the motion detection threshold.

Yet another consideration is the effect of the test system cable. Generally speaking, as the test head is moved vertically, the force exerted on it by the cable will change. A previous disclosure U.S. Patent Application Serial No. PCT/US00/00704 has described the use of a telescopic cable support arm in combination with a leveling mechanism driven by a linear actuator. In that scheme the cable may be leveled with respect to the test head once the vertical position has been reached. It is also possible for the operator to move both the leveler and the test head simultaneously although not necessarily in a coordinated fashion. In the present invention it is apparent that in order to prevent false relative motion signals and/or to eliminate or minimize the contribution of cable force variations to the relative motion noise level, it would be desirable to maintain the relative angle of telescopic cable support angle constant (preferably horizontal). Otherwise the vertical motion will be frequently halted, necessitating power to be restored before operation can continue.

One solution is to couple the cabinet end of the telescopic cable support arm to the vertical support arm 23, so that both ends of the telescopic support arm are moved in unison with the test head. This approach reduces the available payload of the system by the extra cable and cable support apparatus weight that must be borne by the vertical support arm 23. For a system having a very large test head and heavy cable, this could be a significant drawback.

Another solution is to use vertical actuators for the cable support and the vertical arm support 23 that are closely matched in speed. Tunable electric speed control circuits may be utilized to adjust the actuator motor speeds as may be needed. It is noted that speed can be dependent upon load and other factors; accordingly, sensors and feedback mechanisms may be used in conventional ways to dynamically adjust the screw speeds.

The above has described aspects of a very basic control system to be used in conjunction with the present invention in order to illustrate the basic control and safety features. It is anticipated that more complex control systems, based in part on more sophisticated means of sensing, can readily be developed for use with the invention.

Also the description has been based upon the use of a ball screw mechanism 90 to provide the mechanical advantage that enables the invention. Those skilled in the art will recognize that other devices including, but not necessarily limited to, levers, compound levers, stepped pulleys, gears, and other mechanisms can also be employed to achieve the same effect. Accordingly, the invention is not intended to be limited to the use of a ball screw 95.

While the vernier movement is described as being carried by the linear actuator 75, it is also possible to carry the linear actuator 75 with the vernier movement. This of course means that the linear actuator 75 would have to be balanced, but the end result remains the ability to make major vertical adjustments with a ball screw 95 or the equivalent, and make fine adjustments with the vernier movement.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. Apparatus for supporting a load, said apparatus comprising:
    a load support;
    a drive mechanism;
    a vertical support, the load support slidingly attached for linear vertical support by the drive mechanism; and
    a coupling mechanism on the load support having a load bearing part, and an input part to which a balancing force is applied, wherein the amount of motion of the load bearing part is limited to an amount within predetermined linear limits as a vernier adjustment while vertical position of said load is fixed, wherein said coupling mechanism support said load in a balanced condition for applied force external to said apparatus to cause said limited motion.

2. The apparatus of claim 1 wherein said load is a test head.

3. The apparatus of claim 1 wherein said drive mechanism includes a non-compliant linear actuator that drives said load in a vertical direction.

4. The apparatus of claim 3 wherein said linear actuator includes a braking mechanism.

5. The apparatus of claim 3 wherein said linear actuator includes at least one of a thread pitch or an internal friction sufficient to prevent back driving of said load.

6. The apparatus of claim 3 wherein said linear actuator is capable of maintaining said load in a fixed position if said coupling mechanism fails or said load becomes imbalanced.

7. The apparatus of claim 1 wherein said load support includes a lower segment, a middle segment and an upper segment, wherein said middle segment and said upper segment are driven by at least one driving mechanism comprising a linear actuator.

8. The apparatus of claim 1, wherein said balancing force comprises counterweights coupled to said input part.

9. The apparatus of claim 1 wherein said coupling mechanism includes a ball screw.

10. The apparatus of claim 1 further comprising additional load adjustment apparatus which provides freedom of motion in six axes.

11. The apparatus of claim 1 further comprising a base for effecting horizontal movement of said load.

12. The apparatus of claim 1 further comprising a cable pivot for providing an additional degree of motion to said load.

13. The apparatus of claim 1 wherein said load is a test head, said load support includes an test head attachment for receiving said test head, and said test head is supported in alignment with a unit under test such that said test head may perform electrical testing of said unit under test.

14. The apparatus of claim 13, wherein said unit under test is a semiconductor integrated circuit device.

15. The apparatus of claim 13 wherein said test head attachment is selected from the group consisting of a cradle and a yoke.

16. The apparatus of claim 1 wherein said load is a test head, and said coupling mechanism provides a range of vertical motion to said load bearing part relative to said vertical support to allow docking of said test head to a test station apparatus (TSA).

17. The apparatus of claim 1, said apparatus additionally comprising:
a motion detector for determining if a movement of said load support relative to said vertical support is within a predetermined range; and
an interrupt circuit for interrupting said drive mechanism when said movement is outside of said predetermined range.

18. The apparatus of claim 1, said apparatus additionally comprising:
a position sensor for determining if said load support is positioned within a predetermined second range of motion, said second range of motion being less than a first range of motion of said load support.

19. The apparatus of claim 18 wherein operation of said driving mechanism is suspended when said load support is outside of said second range of motion.

20. The apparatus of claim 1 wherein said load support is driven along a motion axis by a motor such that said load support may be positioned at a predetermined position within a range of motion of said load support.

21. The apparatus of claim 20 wherein said motor is a limited torque motor, and said load support is free to move compliantly along said motion axis when said motor is not energized.

22. The apparatus of claim 21 wherein said load is a test head.

23. The apparatus of claim 22 wherein said motor is not energized when said test head is docked to a test station apparatus (TSA).

24. The apparatus of claim 20 additionally comprising a timer such that operation of said motor is controlled by said timer.

25. The apparatus of claim 1 wherein said coupling mechanism includes a cable support for supporting a cable, said cable is supporting said load support, and said cable support includes a leveling mechanism for maintaining a desired angle of said cable support with respect to said load.

26. Apparatus for supporting a load according to claim 1, wherein said coupling mechanism includes a positioning mechanism for driving said load support to a position within a predetermined range, said apparatus further comprising
a timer for timing if said positioning mechanism positions said load support to said position within a predetermined time period.

27. The apparatus of claim 26 wherein said load is a test head.

28. The apparatus of claim 26 wherein said drive mechanism comprises a non-compliant linear actuator that drives said load in a vertical direction.

29. The apparatus of claim 26 wherein said coupling mechanism includes a load bearing part coupled to said load support, and an input part for receiving a balancing force such that said load is supported in a substantially weightless condition.

30. The apparatus of claim 29, wherein said balancing force comprises counterweights coupled to said input part.

31. The apparatus of claim 26 wherein said coupling mechanism includes a ball screw.

32. The apparatus of claim 26 wherein said load is a test head, said load support includes a test head attachment for receiving said test head, and said test head is supported in alignment with a unit under test such that said test head may perform electrical testing of said unit under test.

33. The apparatus of claim 26 wherein said coupling mechanism includes a cable support for supporting a cable, said cable is supporting said load support, and said cable support includes a leveling mechanism for maintaining a desired angle of said cable support with respect to said load.

34. Apparatus for supporting a load according to claim 26, said coupling mechanism having a mechanical advantage greater than one.

35. Apparatus according to claim 26, wherein said source of driven force and said further source of driven force are independently controllable.

36. Apparatus according to claim 26, wherein said direction is linear.

37. The apparatus of claim 1 wherein said vertical support includes a plurality of telescopic segments, wherein at least one of said telescopic segments is driven by a drive mechanism comprising a linear actuator.

38. The apparatus of claim 1 wherein said drive mechanism includes a non-compliant linear actuator that drives said load in a vertical direction.

39. The apparatus of claim 1 wherein said load is a test head, said load support includes a test head attachment for receiving said test head, and said test head is supported in alignment with a unit under test such that said test head may perform electrical testing of said unit under test.

40. The apparatus of claim 1 wherein said coupling mechanism includes a cable support for supporting a cable, said cable is supporting said load support, and said cable support includes a leveling mechanism for maintaining a desired angle of said cable support with respect to said load.

41. The apparatus of claim 1 wherein said drive mechanism comprises a non-compliant linear actuator that drives said load in a vertical direction.

42. The apparatus of claim 1 wherein said vertical support includes a lower segment, a middle segment and an upper segment, wherein said middle segment and said upper segment are driven by at least one linear actuator.

43. The apparatus of claim 1 wherein said load bearing part coupled to said load support, and an input part for receiving a balancing force such that said load is supported in a substantially weightless condition.

44. The apparatus of claim 43, wherein said balancing force comprises counterweights coupled to said input part.

45. The apparatus of claim 1 wherein said coupling mechanism includes a ball screw.

46. The apparatus of claim 1 wherein said load is a test head, said load support includes a test head attachment for receiving said test head, and said test head is supported in alignment with a unit under test such that said test head may perform electrical testing of said unit under test.

47. The apparatus of claim 1 wherein said coupling mechanism includes a cable support for supporting a cable, said cable is supporting said load support, and said cable support includes a leveling mechanism for maintaining a desired angle of said cable support with respect to said load.

48. Apparatus for support a load according to claim 1, said coupling mechanism having a mechanical advantage greater than one.

49. Apparatus for supporting a load according to claim 1, said coupling mechanism above said load for coupling said drive mechanism to said load, said coupling mechanism effecting a second positional movement of said load, said coupling mechanism having a mechanical advantage greater than one.

50. Apparatus according to claim 1, wherein said source of driven force and said further source of driven force are independently controllable.

51. Apparatus according to claim 1, wherein said direction is linear.

* * * * *